US012648154B2

(12) United States Patent
Zhu et al.

(10) Patent No.: US 12,648,154 B2
(45) Date of Patent: Jun. 2, 2026

(54) METHODS OF FABRICATING MEMORY DEVICES INCLUDING CAPACITORS

(71) Applicant: Yangtze Memory Technologies Co., Ltd., Wuhan (CN)

(72) Inventors: Hongbin Zhu, Wuhan (CN); Wei Liu, Wuhan (CN); Wu Liu, Wuhan (CN); Zichen Liu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 311 days.

(21) Appl. No.: 18/233,974

(22) Filed: Aug. 15, 2023

(65) Prior Publication Data

US 2025/0017025 A1     Jan. 9, 2025

Related U.S. Application Data

(63) Continuation of application No. PCT/CN2023/105823, filed on Jul. 5, 2023.

(51) Int. Cl.
H10B 80/00     (2026.01)
H10W 90/00     (2026.01)
H10W 80/00     (2026.01)

(52) U.S. Cl.
CPC ............ H10B 80/00 (2023.02); H10W 90/00 (2026.01); *H10W 80/211* (2026.01);
(Continued)

(58) Field of Classification Search
None
See application file for complete search history.

(56) References Cited

U.S. PATENT DOCUMENTS 9,018,733 B1 * 4/2015 Lee ......................... H10D 1/692
257/532
2008/0182378 A1 7/2008 Gruening-von Schwerin et al.
(Continued)

FOREIGN PATENT DOCUMENTS

CN     110970460     4/2020
CN     113745232 A     12/2021
(Continued)

OTHER PUBLICATIONS

International Search Report in International Appln. No. PCT/CN2023/105823, mailed on Feb. 5, 2024, 6 pages.
(Continued)

*Primary Examiner* — Hung K Vu
(74) *Attorney, Agent, or Firm* — Fish & Richardson P.C.

(57)     ABSTRACT

Methods for fabricating memory devices including capacitors are disclosed. In one aspect, a method of fabricating a memory device including capacitors is described, where each capacitor includes a first electrode and a second electrode separated by an isolation layer. The method includes providing a first wafer including a sacrificial material and the first electrodes disposed in first holes and in contact with the sacrificial material, hybrid bonding the first wafer with a second wafer including a complementary metal-oxide-semiconductor (CMOS) device, removing the sacrificial material to expose the first electrodes, depositing the isolation layer on the first electrodes, and forming the second electrodes on the isolation layer.

19 Claims, 22 Drawing Sheets

(52) U.S. Cl.
CPC ........ *H10W 80/312* (2026.01); *H10W 80/327*
(2026.01); *H10W 90/792* (2026.01)

(56) References Cited

U.S. PATENT DOCUMENTS

| | | |
|---|---|---|
| 2011/0049585 A1 | 3/2011 | Beyer et al. |
| 2012/0064690 A1* | 3/2012 | Hirota ............... H01L 21/02356 |
| | | 257/E21.011 |
| 2020/0328186 A1 | 10/2020 | Liu |
| 2020/0350321 A1 | 11/2020 | Cheng et al. |
| 2022/0231119 A1 | 7/2022 | Liu |
| 2022/0367406 A1* | 11/2022 | Chang .................... H01L 24/80 |
| 2023/0069096 A1 | 3/2023 | Yang et al. |
| 2023/0329011 A1* | 10/2023 | Or-Bach ................. H01L 25/18 |

FOREIGN PATENT DOCUMENTS

| | | |
|---|---|---|
| CN | 115036325 A | 9/2022 |
| CN | 115274677 A | 11/2022 |
| CN | 116584162 A | 8/2023 |

OTHER PUBLICATIONS

Office Action in Chinese Appln. No. 202380010046.9, mailed on
Sep. 2, 2025, 24 pages (with English translation).
Written Opinion in International Appln. No. PCT/CN2023/105823,
mailed on Feb. 5, 2024, 10 pages.
Office Action in Chinese Appln. No. 202380010046.9, mailed on
Mar. 1, 2026, 13 pages (with English translation).

* cited by examiner

100

100'

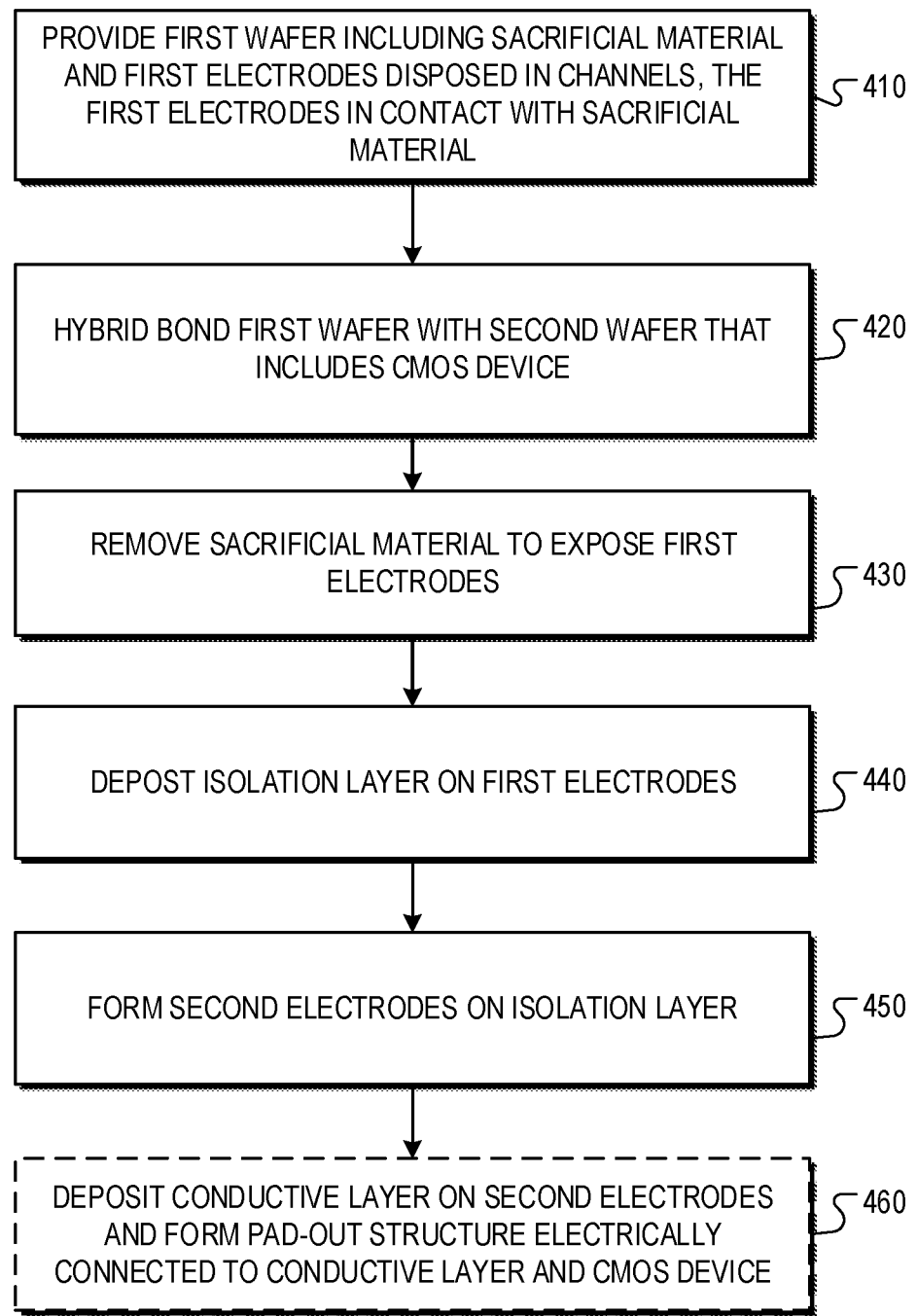

400

PROVIDE FIRST WAFER INCLUDING SACRIFICIAL MATERIAL AND FIRST ELECTRODES DISPOSED IN CHANNELS, THE FIRST ELECTRODES IN CONTACT WITH SACRIFICIAL MATERIAL ⟵ 410

HYBRID BOND FIRST WAFER WITH SECOND WAFER THAT INCLUDES CMOS DEVICE ⟵ 420

REMOVE SACRIFICIAL MATERIAL TO EXPOSE FIRST ELECTRODES ⟵ 430

DEPOST ISOLATION LAYER ON FIRST ELECTRODES ⟵ 440

FORM SECOND ELECTRODES ON ISOLATION LAYER ⟵ 450

DEPOSIT CONDUCTIVE LAYER ON SECOND ELECTRODES AND FORM PAD-OUT STRUCTURE ELECTRICALLY CONNECTED TO CONDUCTIVE LAYER AND CMOS DEVICE ⟵ 460

FIG. 4A

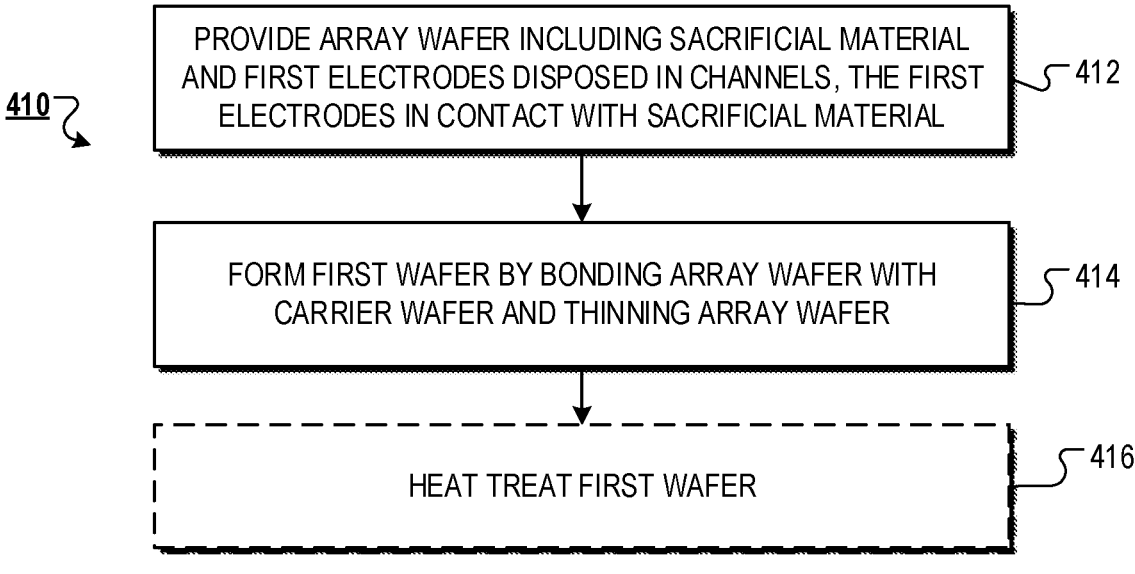

410

PROVIDE ARRAY WAFER INCLUDING SACRIFICIAL MATERIAL AND FIRST ELECTRODES DISPOSED IN CHANNELS, THE FIRST ELECTRODES IN CONTACT WITH SACRIFICIAL MATERIAL — 412

FORM FIRST WAFER BY BONDING ARRAY WAFER WITH CARRIER WAFER AND THINNING ARRAY WAFER — 414

HEAT TREAT FIRST WAFER — 416

FIG. 4B

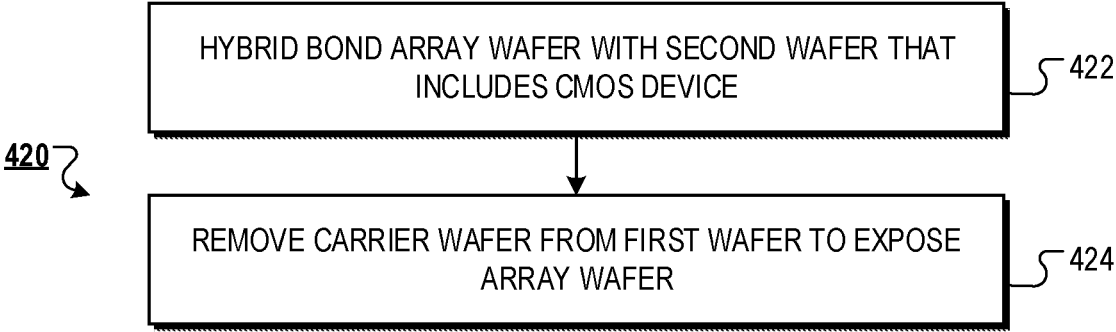

420

HYBRID BOND ARRAY WAFER WITH SECOND WAFER THAT INCLUDES CMOS DEVICE — 422

REMOVE CARRIER WAFER FROM FIRST WAFER TO EXPOSE ARRAY WAFER — 424

FIG. 4C

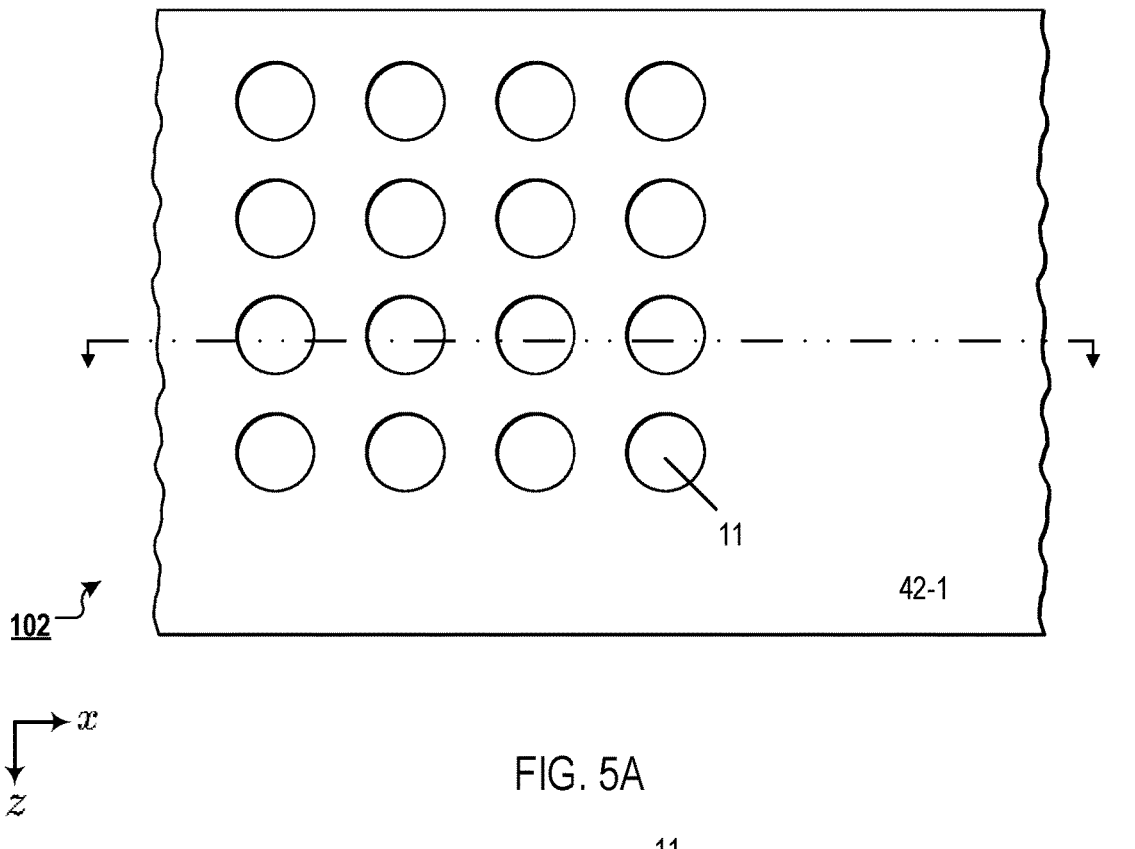
FIG. 5A
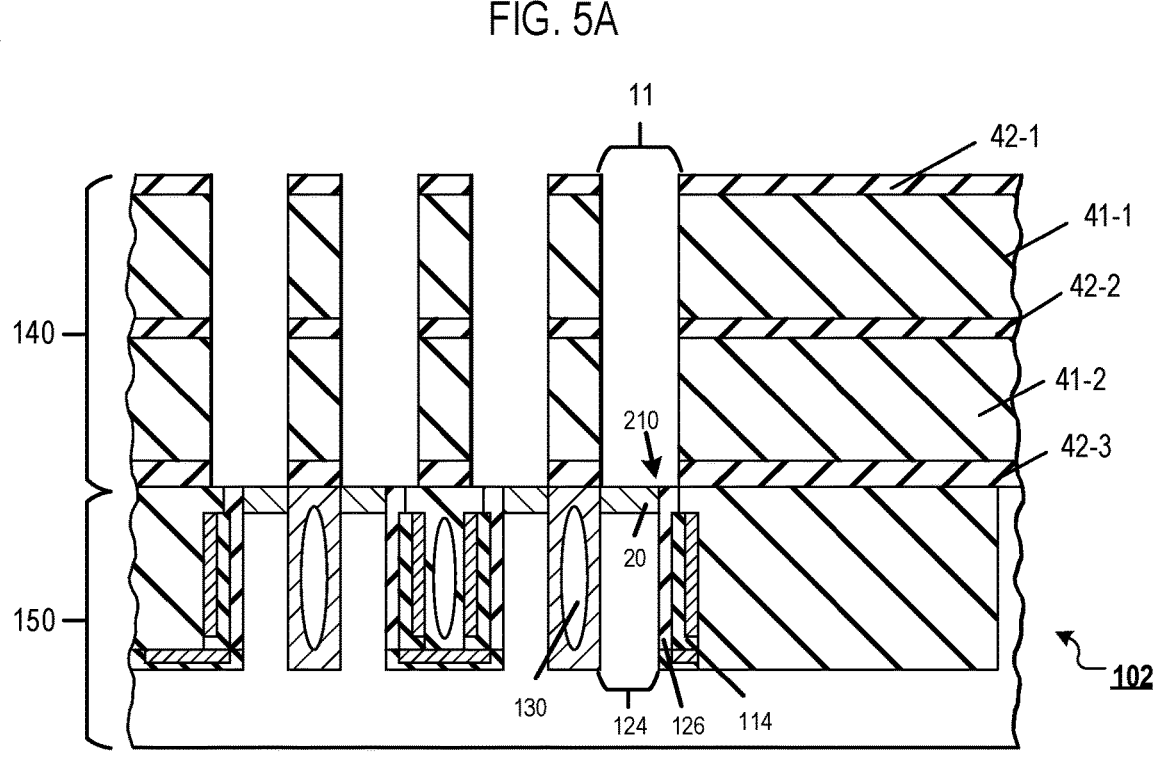
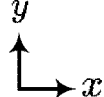
FIG. 5B

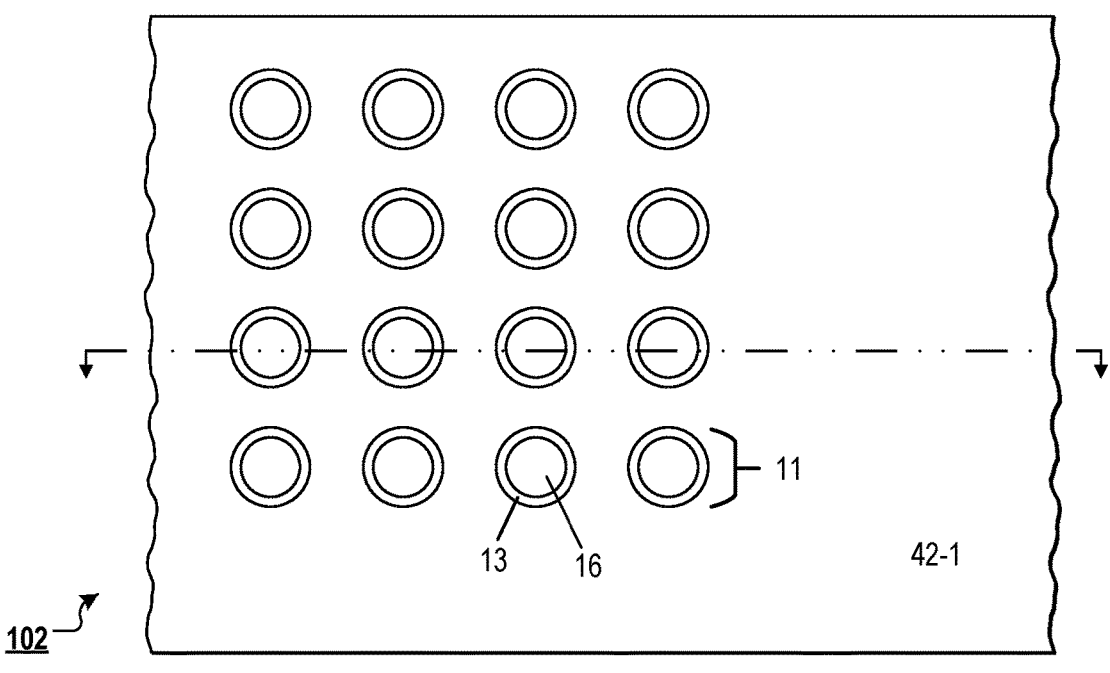
FIG. 6A
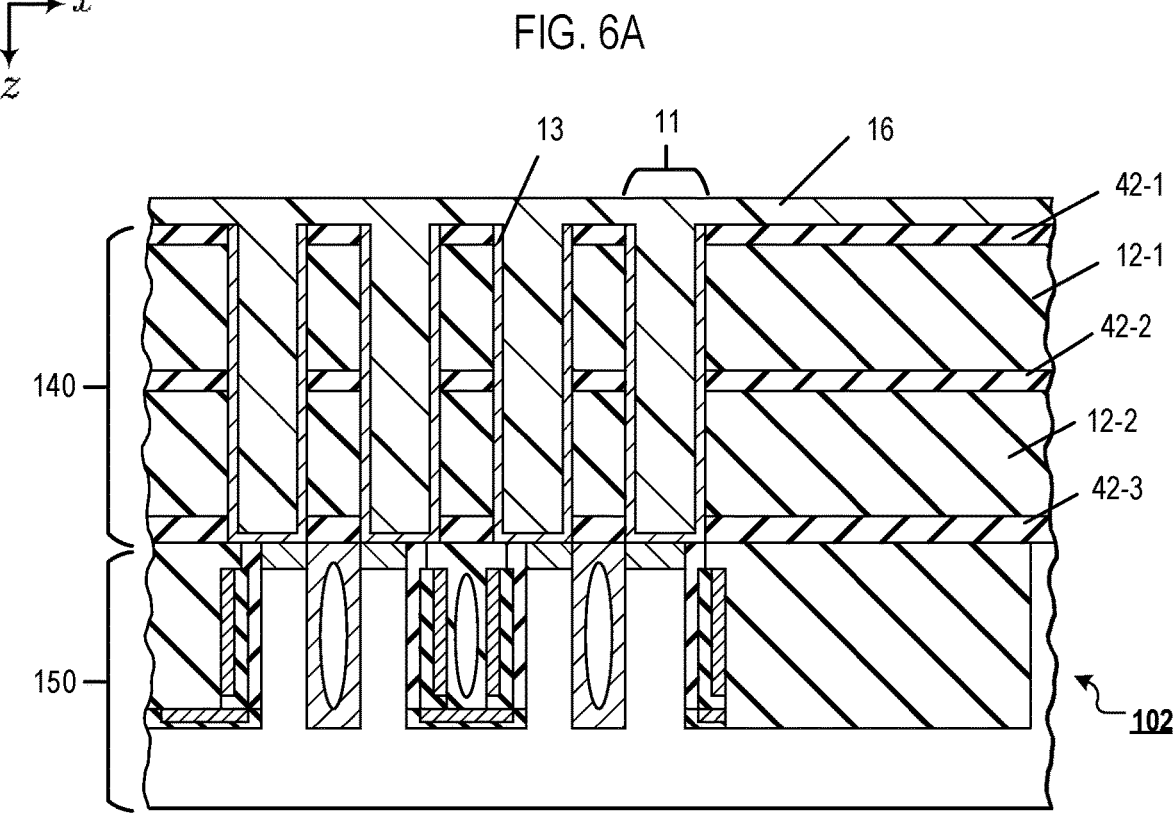
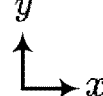
FIG. 6B

Section B-B'

14-2

14-1

15

42-1

102

600

106

104

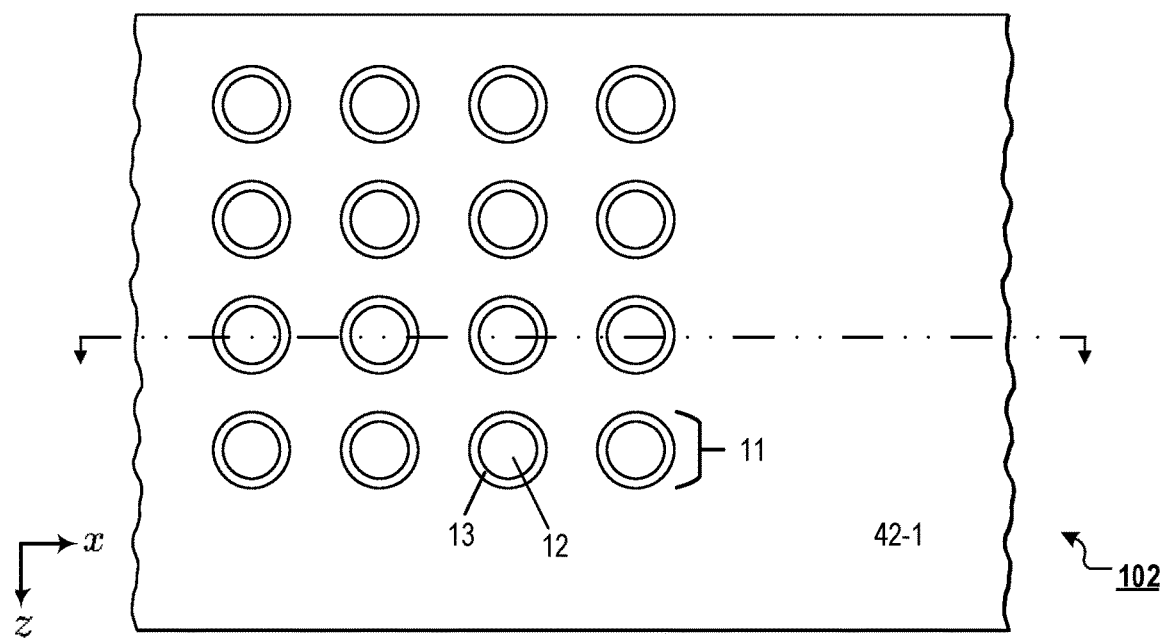
FIG. 7A
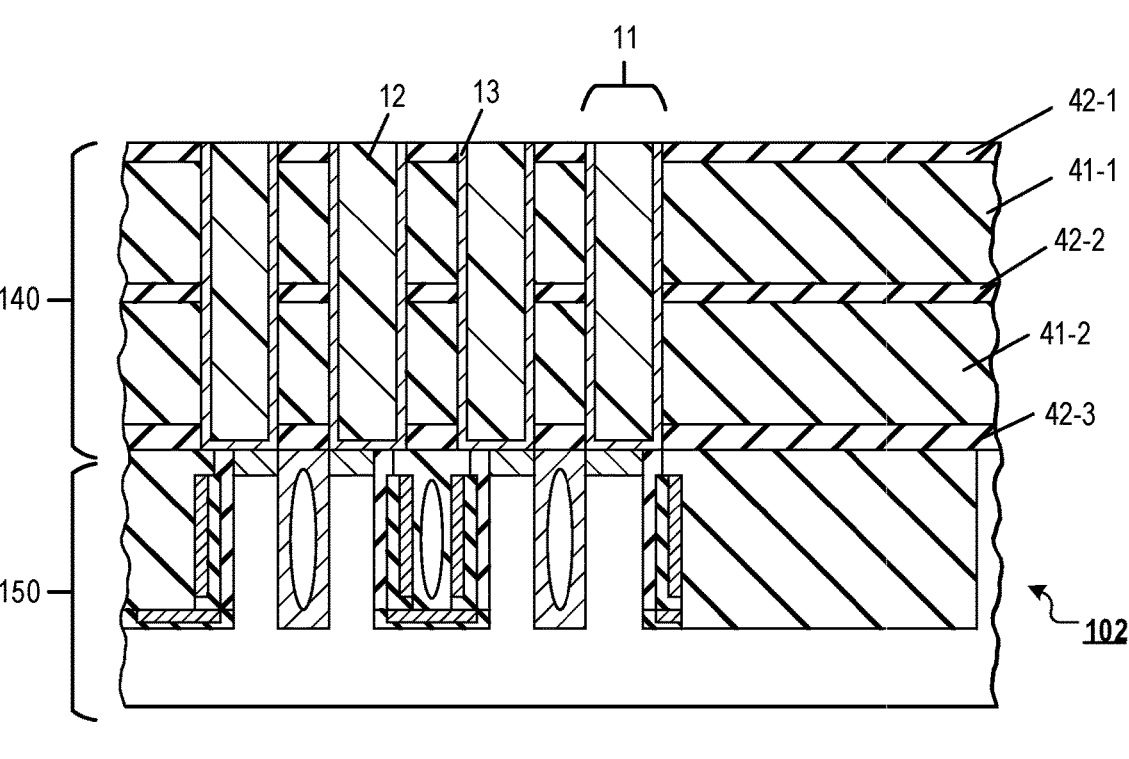
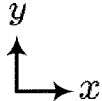
FIG. 7B

METHODS OF FABRICATING MEMORY DEVICES INCLUDING CAPACITORS

CROSS-REFERENCE TO RELATED APPLICATIONS

This application is a continuation of International Application No. PCT/CN2023/105823, filed on Jul. 5, 2023, the disclosure of which is hereby incorporated by reference in its entirety.

TECHNICAL FIELD

This specification relates to the field of semiconductor technology, more particularly, to methods of fabricating memory devices including capacitors.

BACKGROUND

As memory devices shrink to smaller die sizes to reduce manufacturing costs and increase storage density, scaling of planar memory cells faces challenges due to process technology limitations and reliability issues. A three-dimensional (3D) memory architecture can address the density and performance limitations of planar memory cells by stacking memory cells vertically or using memory cells with vertical transistors.

3D memory architecture generally includes multiple arrays of memory cells and peripheral devices for managing data to and from the memory cells. Such memory cells (e.g., DRAM cells) often include capacitors to store bits of data, e.g., metal-oxide-silicon (MOS) capacitors, metal-oxide-metal (MOM) capacitors, or polysilicon-oxide-polysilicon (POP) capacitors. The trend in 3D memory is towards higher density memory cells to increase data storage capacity. However, to reduce manufacturing costs, the dedicated silicon area of a memory chip remains largely unchanged.

SUMMARY

This specification describes methods of fabricating memory devices including capacitors. In accordance with some implementations, the methods can employ one or more high-temperature processes using a sacrificial material in lieu of a high dielectric constant (high-k) material. The sacrificial material can be removed following the high-temperature processes and the high-k material can be subsequently deposited.

In a first aspect, a method of fabricating a memory device including capacitors is described, where each capacitor includes a first electrode and a second electrode separated by an isolation layer. The method includes providing a first wafer including a sacrificial material and the first electrodes disposed in first holes and in contact with the sacrificial material, hybrid bonding the first wafer with a second wafer including a complementary metal-oxide-semiconductor (CMOS) device, removing the sacrificial material to expose the first electrodes, depositing the isolation layer on the first electrodes, and forming the second electrodes on the isolation layer.

In a second aspect, a method of fabricating a memory device including capacitors is described, where each capacitor includes a first electrode and a second electrode separated by an isolation layer. The method includes providing a first wafer including a sacrificial material and the first electrodes disposed in first holes and in contact with the sacrificial material, heat treating the first wafer, removing the sacrificial material to expose the first electrodes, depositing the isolation layer on the first electrodes, and forming the second electrodes on the isolation layer.

In a third aspect, a memory device includes a first wafer including capacitors and a second wafer including a CMOS device, where the second wafer is hybrid bonded with the first wafer. Each capacitor includes a first electrode and a second electrode separated by an isolation layer, where the isolation layer includes a dielectric material having a dielectric constant of 5 or more.

In a fourth aspect, a system includes a memory device and a memory controller electrically connected to the memory device, where the memory controller is configured to control the memory device. The memory device includes a memory plane that includes a first wafer including capacitors and a second wafer including a CMOS device, where the second wafer is hybrid bonded with the first wafer. Each capacitor includes a first electrode and a second electrode separated by an isolation layer, where the isolation layer includes a dielectric material having a dielectric constant of 5 or more.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 4A-4C are flow diagrams of an example process for fabricating a memory device having capacitors.

FIGS. 5A and 5B are top and cross-sectional views, respectively, depicting an example of a prepared semiconductor wafer for use in fabricating a memory device.

FIGS. 6A-6L are various views depicting different stages of an example fabrication method of a memory device including pillar capacitors.

FIGS. 7A-7E are various views depicting different stages of an example fabrication method of a memory device including cup capacitors.

DETAILED DESCRIPTION

Figure 1A:
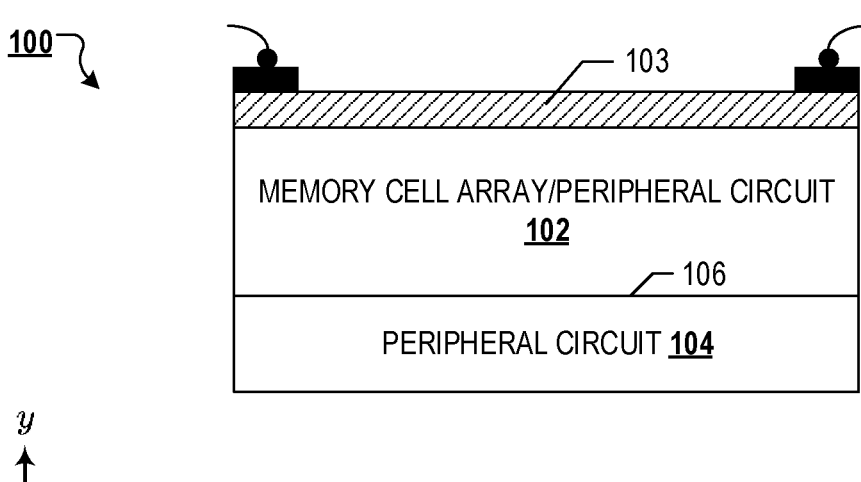
FIG. 1A is a cross-sectional view depicting an example of a memory device.

Particular embodiments of the subject matter described in this specification can be implemented so as to realize one or more of the following advantages.

The present disclosure introduces a memory device fabrication method that can, in some implementations, accommodate one or more high-temperature processes while simultaneously preventing high-k dielectric failure of the memory device's capacitors. In particular, the present disclosure utilizes a sacrificial material in lieu of the high-k material during the high-temperature processes. By introducing the high-k material after the high-temperature processes have been completed, the dielectric constant of the high-k material does not degrade and the capacitors can be formed with higher quality properties (e.g., increased capacitance) compared to other fabrication methods. The capacitors (e.g., vertical capacitors) can, in some instances, provide improved performance of the overall memory device and/or can facilitate smaller feature sizes of the memory device. Consequently, a higher density of components (e.g., DRAM cells) can be incorporated on a wafer (e.g., a silicon wafer) to increase storage capacity of the memory device, as well as improve functionality (e.g., reduce latency and memory cell programming errors).

Reference will now be made in detail to example embodiments, which are illustrated in the accompanying drawings in order to understand and implement the present disclosure, and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It is noted that references in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in contact with an embodiment, it would be within the knowledge of a person of ordinary skill in the pertinent art to affect such feature, structure or characteristic in contact with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a", "an", or "the", again, may be understood to convey a singular usage or to convey a plural usage, depending at least in part upon context.

It should be readily understood that the meaning of "on", "above", and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath", "below", "lower", "above", "upper", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The term "vertical" refers to the direction perpendicular to the surface of a semiconductor substrate, and the term "horizontal" refers to any direction that is parallel to the surface of that semiconductor substrate.

As used herein, the term "substrate" generally refers to a material onto which subsequent material layers are added. The substrate itself can include multiple layers of material and/or be patterned, e.g., with arrays of first holes. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as various dielectric materials, a glass, a plastic, an oxide, or a sapphire wafer. A memory device can include multiple substrates.

As used herein, the term "layer" generally refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical contacts are formed) and one or more dielectric layers.

Some embodiments in accordance with the present disclosure provide structures and fabricating methods for vertical capacitors with higher density and less consumption of silicon area on a wafer. For example, the vertical capacitors can be used as storage units for vertical transistors of a DRAM memory array. In general, capacitance is proportional to the area of a capacitor, therefore a planar capacitor involves large silicon area in order to provide sufficient capacitance for the integrated circuitry of a memory device. By using vertical capacitors in a memory device instead of planar capacitors, sufficient capacitance can be provided while the overall memory density can be increased and manufacturing costs reduced.

The fabrication methods described in this specification can be used to form high quality vertical capacitors in semiconductor devices even when one or more high-temperature processes are involved in fabrication. The high-temperature processes can include rapid thermal processing (RTP), rapid thermal annealing (RTA), various heat treatments, hybrid wafer bonding (e.g., die-to-wafer (D2 W) or wafer-to-wafer (W2 W) hybrid bonding), other types of wafer bonding (e.g., direct bonding, eutectic bonding, glass frit bonding, thermocompression bonding, etc.), among other high-temperature processes that may be involved in fabricating a state-of-the-art semiconductor device. The fabrication methods disclosed herein can also be employed for planar capacitors when such capacitor structures are desirable, e.g., in planar memory devices.

High-temperature processes can involve temperatures of about 500° C. or more (e.g., about 600° C. or more, about 700° C. or more, about 800° C. or more, about 900° C. or more, about 1000° C. or more) and can be implemented at various points in the overall fabrication pipeline of a semiconductor device. Generally, one or more components of a semiconductor device can involve a high-temperature process to facilitate formation of the components. For example, in a memory device, high-temperature processes such as RTA can be used to form bit lines as these components typically involve generation of metal silicides. As another example, hybrid bonding generally involves a high-temperature process to generate a direct bond interconnect (DBI), that is, a permanent bond combining a dielectric bond (e.g., silicon oxide ($SiO_x$)) with embedded metal (e.g., copper (Cu)). Hybrid bonding has become an industry-wide practice in semiconductor manufacturing to form metal interconnections between two semiconducting wafers, e.g., two silicon wafers. For memory devices, hybrid bonding can allow one or more peripheral devices, such as a complementary metal-oxide-semiconductor (CMOS) device, to interact with various components of the memory device, e.g., the memory cell transistors. Hybrid bonding can accommodate advanced 3D device stacking, higher memory density, larger bandwidths, improved efficiency, improved speed and performance, higher power, among several other advantages.

However, capacitors of the memory device can be sensitive to high-temperature processes. Specifically, high dielectric constant (high-k) materials, typically used as isolation layers between the electrodes of the capacitors, can degrade in a high-temperature process. High-k dielectric materials generally refer to dielectric materials having a dielectric constant greater than the dielectric constant of silicon oxide ($SiO_2$), e.g., a dielectric constant of about 3.7 or more (e.g. about 4 or more, about 4.5 or more, about 5 or more, about 5.5 or more, about 6 or more, about 6.5 or more, about 7 or more). Such high-k materials can include, for example, aluminum oxide ($Al_2O_3$), hafnium oxide ($HfO_2$), zirconium oxide ($ZrO_2$), titanium oxide ($TiO_2$), or combinations thereof. During high-temperature processes (e.g., involving temperatures of about 500° C. or more), the high-k material is prone to failure due to high temperatures altering its crystal structure and/or phase. For example, high-temperature processes can cause crystals in the high-k material to grow, increasing the percentage of large crystals in the high-k material. In such cases, the dielectric constant of the high-k material generally decreases and the high-k material provides reduced capacitance. In some cases, following one or more high-temperature processes, the high-k material can have a dielectric constant of about 6 or less (e.g., about 5.5 or less, about 5 or less, about 4.5 or less, about 4 or less, about 3.7 or less, about 3.5 or less).

To address one or more of these aforementioned issues, the present disclosure introduces a memory device fabrication method that can, in some implementations, accommodate one or more high-temperature processes while simultaneously preventing high-k dielectric failure of the memory device's capacitors. In particular, the present disclosure utilizes a sacrificial material in lieu of the high-k material during the high-temperature processes. By introducing the high-k material after the high-temperature processes have been completed, the dielectric constant of the high-k material does not degrade and the capacitors can be formed with higher quality properties, e.g., increased capacitance.

FIG. 1A illustrates a schematic view of a cross-section of an example memory device 100. Memory device 100 represents an example of a bonded chip that can be formed using the fabrication methods disclosed herein. In some implementations, at least some of the memory cell array and peripheral circuits of memory device 100 are formed separately on different wafers in parallel and then jointed to form a bonded chip (a process referred to herein as a "parallel process"). It is noted that x- and y-axes are added in FIG. 1A to further illustrate the spatial relationships of the components of a semiconductor device.

Memory device 100 can include a first wafer 102 including an array of memory cells (also referred to herein as a "memory cell array"). In some implementations, the memory cell array includes an array of DRAM cells. For ease of description, a DRAM cell array may be used as an example for describing the memory cell arrays in the present disclosure. In some implementations, each DRAM cell includes a capacitor for storing a bit of data as well as one or more transistors (a.k.a. pass transistors) that control (e.g., switch and selecting) access to it. In some implementations, each DRAM memory cell is a one-transistor, one-capacitor (1T1C) cell. Since transistors usually leak a small amount of charge, the capacitors may slowly discharge, causing information stored in them to drain. As such, a DRAM cell can be refreshed to retain data, for example, by the peripheral circuits.

As shown in FIG. 1A, first wafer 102 can include at least some of the peripheral circuits of the memory device 100. The second wafer 104 can include the remaining peripheral circuits of the memory device 100. That is, the peripheral circuits of the memory device 100 can be separated into at least two wafers 102 and 104, with some peripheral circuitry and the memory cell array integrated into first wafer 102. The peripheral circuits (a.k.a., control and sensing circuits) can include any suitable digital, analog, and/or mixed-signal circuits used for facilitating the operations of the memory cell array. For example, the peripheral circuits can include one or more of a page buffer, a decoder (e.g., a row decoder and a column decoder), a sense amplifier, a driver (e.g., a word line driver), a data In/Out buffer, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in first and second wafers 102 and 104 can use CMOS technology, e.g., which can be implemented with logic processes in any suitable technology nodes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.).

First wafer 102 and second wafer 104 are stacked in different planes. As a result, the memory cell array and peripheral circuits in first wafer 102, and the peripheral circuits in second wafer 104, can be stacked in different planes to reduce the planar size of memory device 100, compared with memory devices in which all the peripheral circuits are disposed in the same plane. As shown in FIG. 1A, memory device 100 further includes a bonding interface 106 between first wafer 102 and second wafer 104. Bonding interface 106 can be an interface between two semiconductor wafers formed by any suitable bonding technologies as described below in detail, e.g., hybrid bonding. In some implementations, bonding interface 106 is the place at which bonding layers are met and bonded. In practice, bonding interface 106 can be a layer with a certain thickness that includes the bottom surface of bonding layer of first wafer 102 and the top surface of bonding layer of second wafer 104.

First wafer 102 and second wafer 104 can be fabricated separately (and in parallel in some implementations) by the parallel process, such that the thermal budget of fabricating one of first and second wafers 102 and 104 does not limit the processes of fabricating another one of first and second wafers 102 and 104. Moreover, a large number of interconnects (e.g., bonding contacts) can be formed across bonding interface 106 to make direct, short-distance (e.g., micron-level) electrical connections between wafers 102 and 104, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer among the memory cell array and the different peripheral circuits in first and second wafers 102 and 104 can be performed through the interconnects (e.g., bonding contacts) across bonding interface 106. By vertically integrating first and second wafers 102 and 104, the chip size can be reduced and the memory cell density can be increased.

Figure 1B:
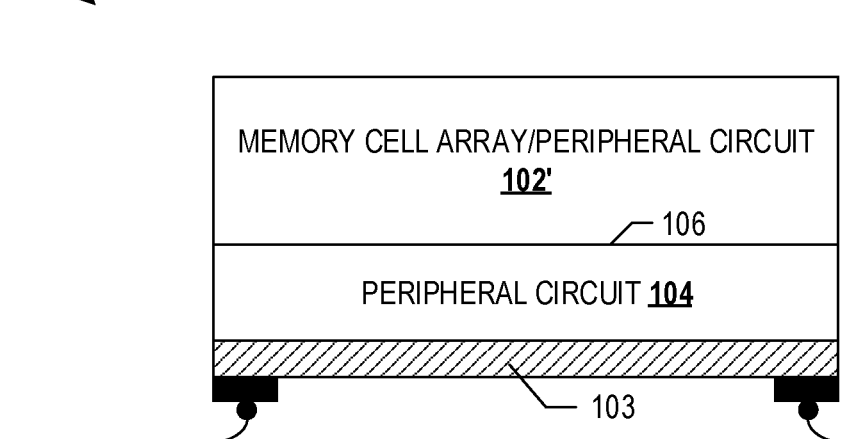
FIG. 1B is a cross-sectional view depicting another example of a memory device.

Moreover, as shown in FIG. 1A, first wafer 102 of memory device 100 can further include a pad-out interconnect layer 103 for pad-out purposes, i.e., interconnecting with external devices using contact pads on which bonding wires can be soldered. In some examples, pad-out interconnect layer 103 may be included in second wafer 104 that does not include the memory cell array. For example, as shown in FIG. 1B, second wafer 104 of a memory device 100' may include bonding interface 106. That is, pad-out interconnect layer 103 may be arranged on either side of memory device 100 or 100'.

Figure 2A:
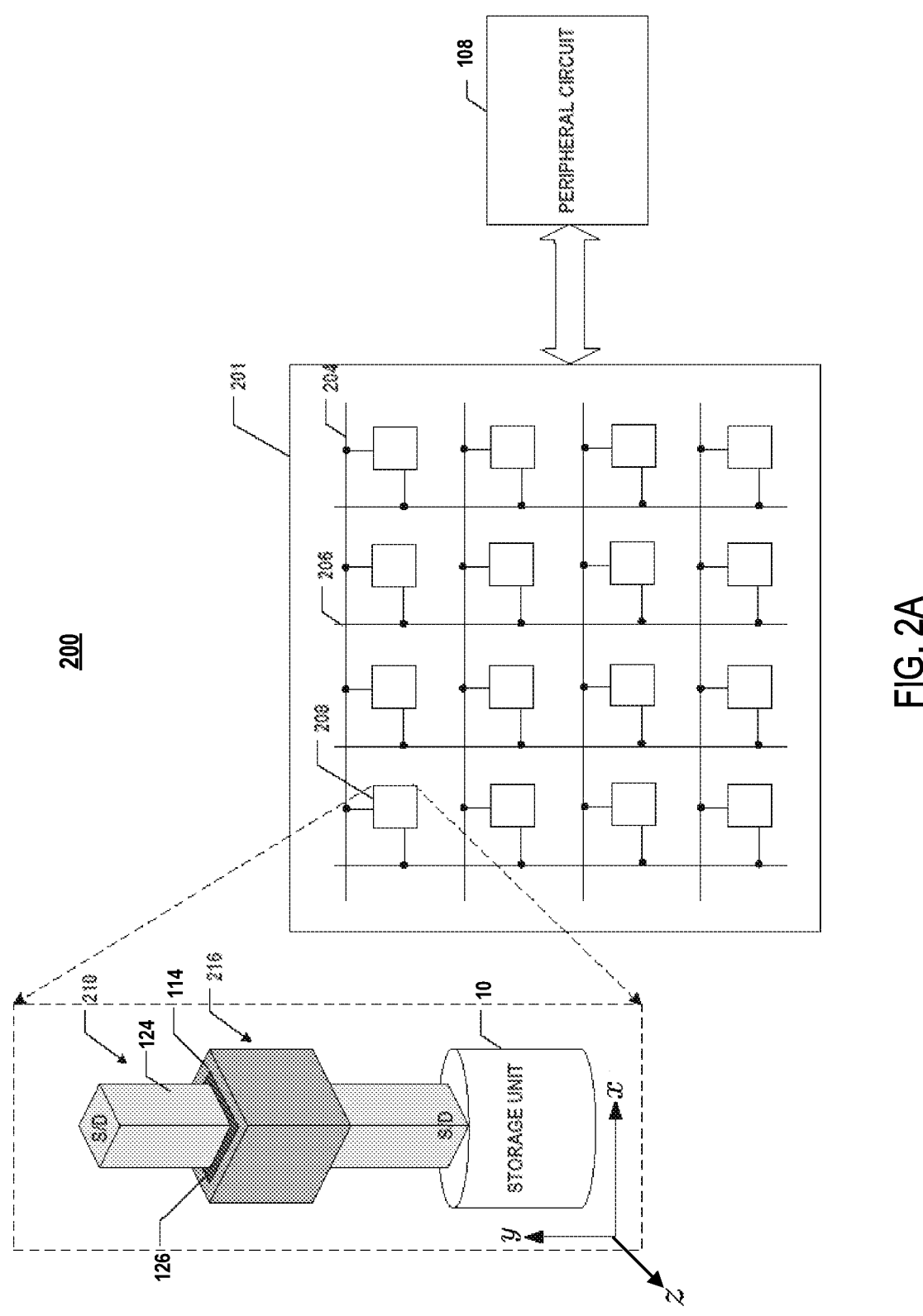
FIG. 2A is a schematic diagram depicting an example of a memory device including peripheral circuits and an array of memory cells each having a vertical transistor.

FIG. 2A illustrates a schematic diagram of a memory device 200 (which can be operationally and/or structurally similar to the memory device 100) including peripheral circuits 108 and an array of memory cells 208 each having a vertical transistor 210. Memory device 200 can include a memory cell array 201 and peripheral circuits 108 coupled to memory cell array 201. Memory cell array 201 can be any suitable memory cell array in which each memory cell 208 includes a vertical transistor 210 and a vertical capacitor 10. The vertical capacitor 10 is coupled to the vertical transistor 210 for storing charge as the binary information of the memory cell 208.

As shown in FIG. 2A, the memory cells 208 in memory cell array 201 can be arranged in a two-dimensional (2D) array having rows and columns. Memory device 200 can include word lines 204 coupling peripheral circuits 108 and memory cell array 201 for controlling the switch of vertical transistors 210 in memory cells 208 located in a row, as well as bit lines 206 coupling peripheral circuits 108 and memory cell array 201 for sending data to and/or receiving data from memory cells 208 located in a column. That is, each word line 204 is coupled to a respective row of memory cells 208, and each bit line 206 is coupled to a respective column of memory cells 208.

Vertical transistors 210, such as vertical metal-oxide-semiconductor field-effect transistors (MOSFETs), include a semiconductor body 124 extending vertically (in the y-direction) above the substrate (not shown). That is, semiconductor body 124 can extend above the top surface of the substrate to expose not only the top surface of semiconductor body 124, but also one or more side surfaces thereof. As shown in FIG. 2A, for example, semiconductor body 124 can have a cuboid shape to expose four sides thereof. It is understood that semiconductor body 124 may have any suitable 3D shape, such as polyhedron shapes or a cylinder shape. That is, the cross-section of semiconductor body 124 in the plan view (e.g., in the x-z plane) can have a square shape, a rectangular shape (or a trapezoidal shape), a circular (or an oval shape), or any other suitable shapes.

As shown in FIG. 2A, vertical transistor 210 also includes a gate structure 216 in contact with one or more sides of semiconductor body 124, i.e., in one or more planes of the side surface(s) of the active region. In other words, the active region of vertical transistor 210, i.e., semiconductor body 124, can be at least partially surrounded by gate structure 216. Gate structure 216 can include a gate dielectric 126 over one or more sides of semiconductor body 124, e.g., in contact with four side surfaces of semiconductor body 124 as shown in FIG. 2A. Gate structure 216 can also include a gate electrode 114 over and in contact with gate dielectric 126. Gate dielectric 126 can include any suitable dielectric materials, such as silicon oxide, silicon nitride, silicon oxynitride, or high-k dielectrics. For example, gate dielectric 126 may include silicon oxide, i.e., gate oxide. Gate electrode 114 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, gate electrode 114 may include doped polysilicon, i.e., a gate poly. In some implementations, gate electrode 114 includes multiple conductive layers, such as a W layer over a TiN layer. It is understood that gate electrode 114 and word line 204 may be a continuous conductive structure in some examples. In other words, gate electrode 114 may be viewed as part of word line 204 that forms gate structure 216, or word line 204 may be viewed as the extension of gate electrode 114 to be coupled to peripheral circuits 108.

As shown in FIG. 2A, vertical transistor 210 can further include a pair of a source and a drain (S/D, dope regions, a.k.a., source electrode and drain electrode) formed at the two ends of semiconductor body 124 in the vertical direction (the y-direction), respectively. The source and drain can be doped with any suitable P-type dopants, such as boron (B) or Gallium (Ga), or any suitable N-type dopants, such as phosphorus (P) or arsenic (As). The source and drain can be separated by gate structure 216 in the vertical direction (the y-direction). In other words, gate structure 216 is formed vertically between the source and drain. As a result, one or more channels (not shown) of vertical transistor 210 can be formed in semiconductor body 124 vertically between the source and drain when a gate voltage applied to gate electrode 114 is above the threshold voltage of vertical transistor 210. That is, each channel of vertical transistors 210 is also formed in the vertical direction along which semiconductor body 124 extends.

In some implementations, vertical transistor 210 is a multi-gate transistor. That is, gate structure 216 can be in contact with more than one side of semiconductor body 124 (e.g., four sides in FIG. 2A) to form more than one gate, such that more than one channel can be formed between the source and drain in operation. Although vertical transistor 210 is shown as a multi-gate transistor in FIG. 2A, the vertical transistors 210 may also include single-gate transistors. That is, gate structure 216 may be in contact with a single side of semiconductor body 124, for example, for the purpose of increasing the transistor and memory cell density.

Peripheral circuits 108 can be coupled to memory cell array 201 through bit lines 206, word lines 204, and any other suitable metal wirings. As described above, peripheral circuits 108 can include any suitable circuits for facilitating the operations of memory cell array 201 by applying and sensing voltage signals and/or current signals through word lines 204 and bit lines 206 to and from each memory cell 208. Peripheral circuits 108 can include various types of peripheral circuits (e.g., a CMOS device) formed using CMOS technologies.

Figure 2B:
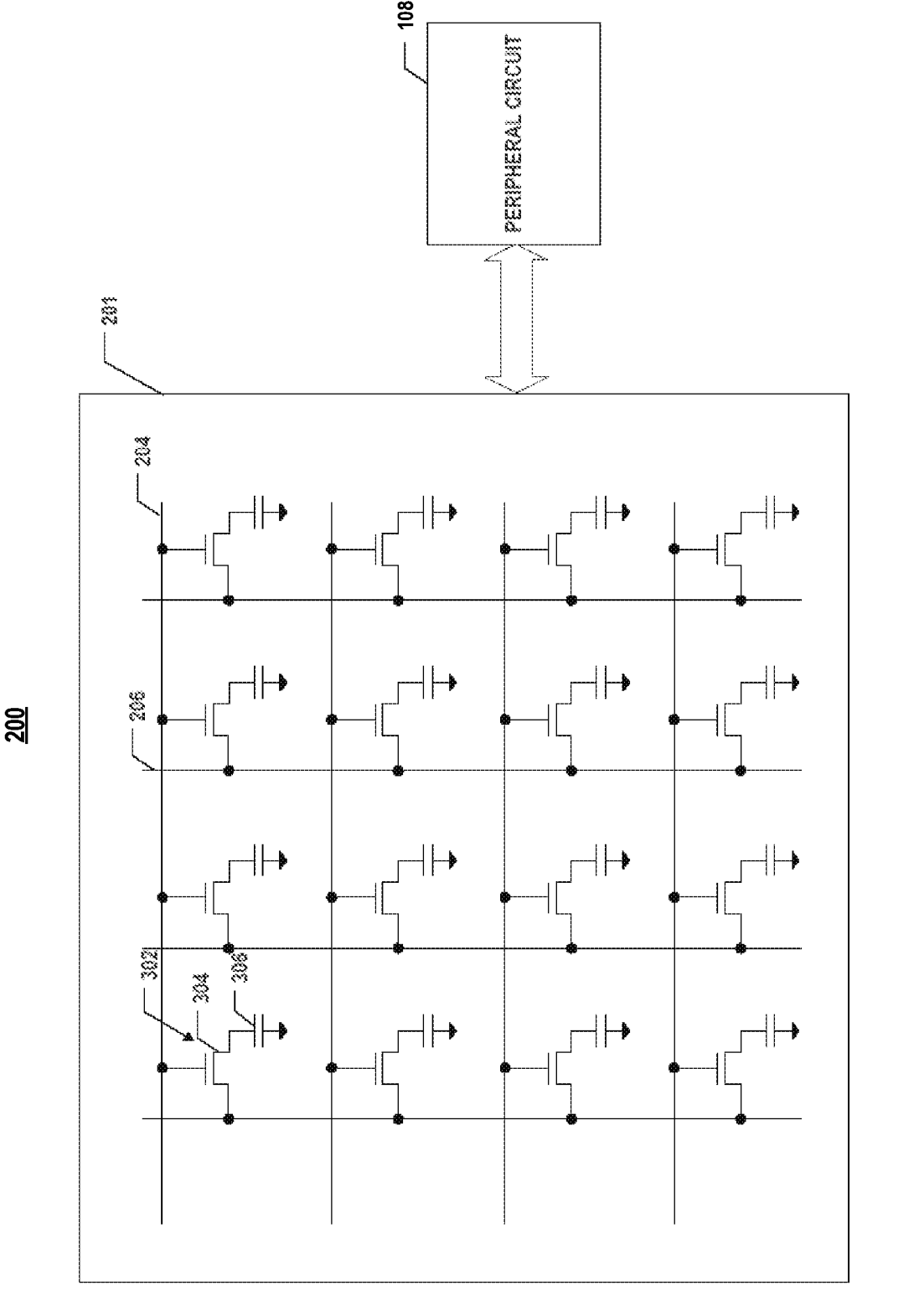
FIG. 2B is a schematic circuit diagram depicting an example of a memory device including peripheral circuits and an array of dynamic random-access memory (DRAM) cells.

As shown in FIG. 2A, vertical capacitor 10 can be coupled to the source or the drain of vertical transistor 210 and is capable of storing binary data (e.g., 0 and 1). In some implementations, vertical transistor 210 controls the selection and/or the state switch of the respective capacitor 10. As shown in FIG. 2B, in some implementations, each memory cell 208 is a DRAM cell 302 including a transistor 304 (e.g., implementing using vertical transistors 210 in FIG. 2A) and a capacitor 306 (e.g., an example of capacitor 10 in FIG. 2A). The gate of transistor 304 (e.g., corresponding to gate electrode 114) may be coupled to word line 204, one of the source and the drain of transistor 304 may be coupled to bit line 206, the other one of the source and the drain of transistor 304 may be coupled to a first electrode of capacitor 306, and a second electrode of capacitor 306 may be coupled to ground.

FIGS. 3A-3D are cross-sectional views depicting different stages of a memory device during a fabrication method involving high-temperature processes. Specifically, FIGS. 3A-3D show formation of a memory device 300 (which can be operationally and/or structurally similar to the memory device 100 and/or memory device 200) having vertical capacitors 10 that each include an isolation layer (e.g., a high-k dielectric material) between two electrodes (e.g., a first electrode 13 and a second electrode 14). In general, one or more components of the capacitors 10 are substituted with a sacrificial material 12 to support the structure of the capacitors 10 throughout the fabrication steps involving high-temperature processes. The sacrificial material 12 is then removed after the high-temperature processes have been completed and the high-k material is deposited as an isolation layer between the first electrode 13 and the second electrode 14 of each capacitor 10 (see for example, FIG. 3C).

Figure 3A:
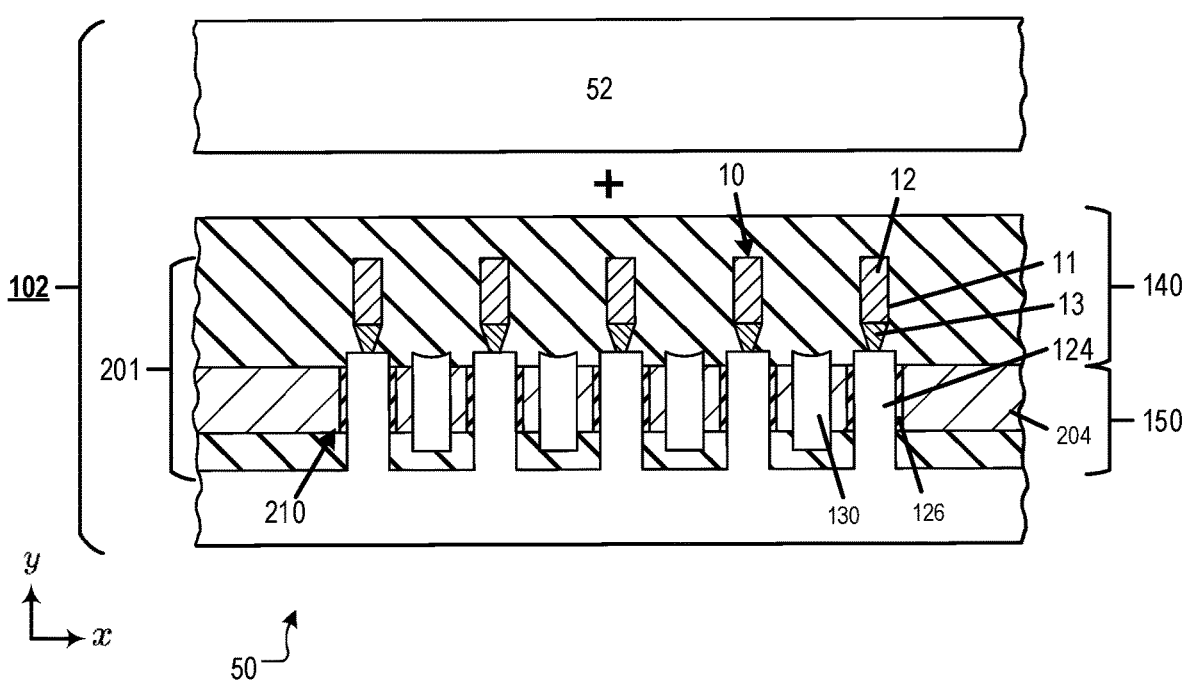
FIGS. 3A-3D are cross-sectional views depicting different stages of an example fabrication method of a memory device including capacitors.

FIG. 3A shows a first stage of forming the memory device 300 that includes providing a first wafer 102. In this example, the first wafer 102 is formed by bonding a carrier wafer 52 to the top of an array wafer 50. The array wafer 50 and carrier wafer 52 can be bonded with any suitable wafer bonding techniques (e.g., direct bonding, adhesive bonding, thermocompression bonding, reactive bonding, etc.) which can include one or more high-temperature processes. Generally, carrier wafer 52 is utilized to support (e.g., carry) the array wafer 50 throughout various steps in the fabrication process and does not include any functional components of the memory device 300. In some implementations, first wafer 102 and array wafer 50 are the same wafer such that carrier wafer 52 is not involved in the fabrication process.

The array wafer 50 provides a memory cell array 201 that includes multiple memory cells. Each memory cell includes a vertical transistor 210 and structures of a vertical capacitor 10. For example, vertical transistors 210 can perform the selection and/or the state switch for bits of data stored in the vertical capacitors 10 of the resultant memory device 300. In some implementations, the resulting memory device 300 is a DRAM device in which memory cells are provided in the form of an array of DRAM cells. As described in FIG. 2A, each memory cell can include a semiconductor body 124 surrounded by a gate structure that includes a gate dielectric 126 and a gate electrode. Gate electrodes are depicted in FIGS. 3A-3D as being continuous portions of a word line 204. As shown in FIG. 3A, each semiconductor body 124 can extend vertically through the word line 204. Vertical transistors 210 can be separated by dielectric material 130 (in some cases air gaps) to electrically isolate two adjacent vertical transistors 210.

Structures for vertical capacitors 10 are provided in the form of an array of first holes 11 penetrating through a semiconductor structure 140 located above a transistor array region 150 that includes the vertical transistors 210 and the word line 204. Semiconductor structure 140 can include any suitable semiconducting or insulating materials, e.g., silicon, gallium arsenide, silicon dioxide ($SiO_2$), silicon nitride ($Si_3N_4$), silicon oxynitride ($SiO_xN_y$), or combinations thereof. The first holes 11 are filled with a sacrificial material 12. The sacrificial material 12 can include various different materials depending on the implementation, e.g., an insulating material (e.g., $SiO_2$, $Si_3N_4$, carbon), a semiconducting material (e.g., silicon, gallium arsenide), or others. Since the sacrificial material 12 is generally an intermediate step, i.e., is removed at some point in the fabrication method, sacrificial material 12 can be chosen based on a convenient material removal process, e.g., a wet etching method, an asher method, etc. In some implementations, the sacrificial material 12 is included in the semiconductor structure 140 and the first holes 11 are filled with a filling material. The semiconductor structure 140 can be patterned and/or include multiple layers of sacrificial material 12. In general, the sacrificial material 12 supports the capacitors 10, e.g., by filling the first holes 11 and/or being included in the semiconductor structure 140, throughout the fabrication steps involving high-temperature processes. The first holes 11 have a cylindrical (e.g., pillar) shapes but various geometries are possible, e.g., conical, tapered, cuboid, etc. First electrodes 13 line the first holes 11 and are in contact with the sacrificial material 12. The first electrodes 13 can be composed of any suitable conductive material, e.g., titanium nitride (TiN). In this case, the first electrodes 13 interface with the semiconductor bodies 124, e.g., such that the vertical transistors 210 can communicate with capacitors 10 of the resultant memory device 300 to store bits of data.

Figure 3B:
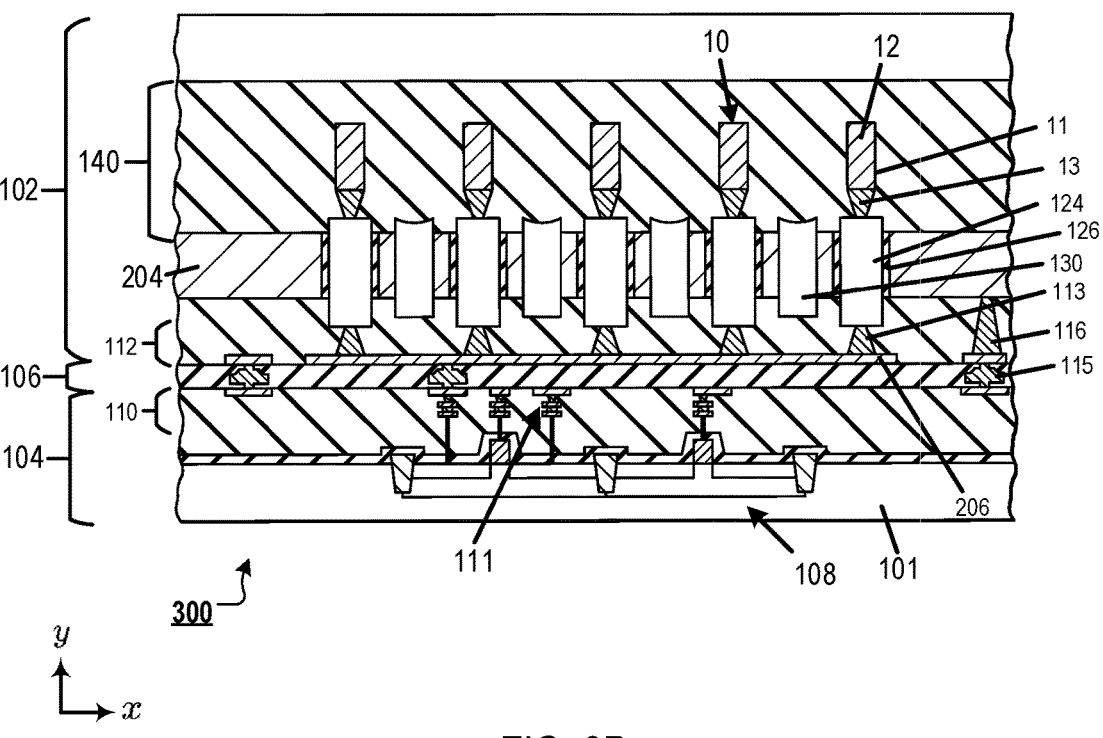

FIG. 3B shows a second stage in formation of the memory device 300 that includes hybrid bonding the first wafer 102 to the top of a second wafer 104. Second wafer 104 includes peripheral circuits 108 (e.g., a CMOS device) that can be manufactured, for example, in the parallel process described above. As mentioned previously, hybrid bonding generally involves at least one high-temperature process to form interconnects between the first wafer 102 and the second wafer 104. As seen in FIG. 3B, in some implementations, the bottom surface of first wafer 102, i.e., the bottom surface of the array wafer 50 portion of first wafer 102, can be thinned before hybrid bonding with second wafer 104. For example, excess material can be removed and/or the bottom surface can be polished by chemical mechanical processing (CMP), or other suitable method, to provide a clean interface for hybrid bonding.

As seen in FIG. 3B, memory device 300 is a bonded chip formed by first wafer 102 and second wafer 104 jointed at a bonding interface 106 therebetween. Second wafer 104 includes a substrate 101, which can be composed of silicon (e.g., crystalline silicon (c-Si) such as polycrystalline silicon (poly-Si) or monocrystalline silicon (mono-Si)), silicon germanium (SiGe), gallium arsenide (GaAs), germanium (Ge), silicon-on-insulator (SOI). Substrate 101 includes two lateral surfaces (e.g., a top surface and a bottom surface) extending laterally in the x and/or z direction (i.e., the lateral directions).

Second wafer 104 of memory device 300 can include peripheral circuits 108 on substrate 101. In some implementations, peripheral circuit 108 is configured to control and sense memory device 300. Peripheral circuit 108 can be any suitable digital, analog, and/or mixed-signal control and sensing circuits used for facilitating the operation of memory device 300 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuit 108 can include transistors formed on substrate 101, in which the entirety or part of the transistors are formed in substrate 101 (e.g., below the top surface of substrate 101) and/or directly on substrate 101. Isolation regions (e.g., shallow trench isolations (STIs)) and doped regions (e.g., source regions and drain regions of the transistors) can be formed in substrate 101 as well. The transistors can be high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.). In some implementations, peripheral circuit 108 may further include any other circuits compatible with the advanced logic processes including logic circuits, such as processors and programmable logic devices (PLDs), or memory circuits, such as static random-access memory (SRAM) and dynamic RAM (DRAM).

Second wafer 104 of memory device 300 can further include an interconnect layer 110 near bonding interface 106 and above the peripheral circuits 108. Interconnect layer 110 can include multiple interconnects 111 and dielectrics electrically isolating interconnects 111. Interconnects 111 can include conductive materials including, but not limited to, W, Co, Cu, Al, silicides, or any combination thereof. The remaining area of interconnect layer 110 can be formed with dielectrics including, but not limited to, silicon oxide, silicon nitride, silicon oxynitride, low-k dielectrics, or any combination thereof.

Similarly, as shown in FIG. 3B, first wafer 102 of memory device 300 can also include a interconnect layer 112 near bonding interface 106. Interconnect layer 112 can include multiple bit line contacts 113 connected to a bit line 206 and dielectrics electrically isolating bit line contacts 113. Bit line contacts 113 and bit line 206 can include conductive materials including, but not limited to, W, Co, Cu, Al, silicides, or any combination thereof. The remaining area of interconnect layer 112 can be formed with dielectrics including, but not limited to, silicon oxide, silicon nitride, silicon oxynitride, low-k dielectrics, or any combination thereof. Word line 204 of first wafer 120 can be coupled to peripheral circuits 108 in second wafer 104 through word line contacts 116 in interconnect layer 112, bonding contacts 115 in bonding interface 106, and the interconnects 111 in interconnect layer 110. Bonding contacts 115 can be used for hybrid bonding first wafer 102 to second wafer 104.

First wafer 102 can be bonded on top of second wafer 104 in a face-to-face manner at bonding interface 106. In this case, bonding interface 106 is disposed between interconnect layers 110 and 112 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously.

Figure 3C:
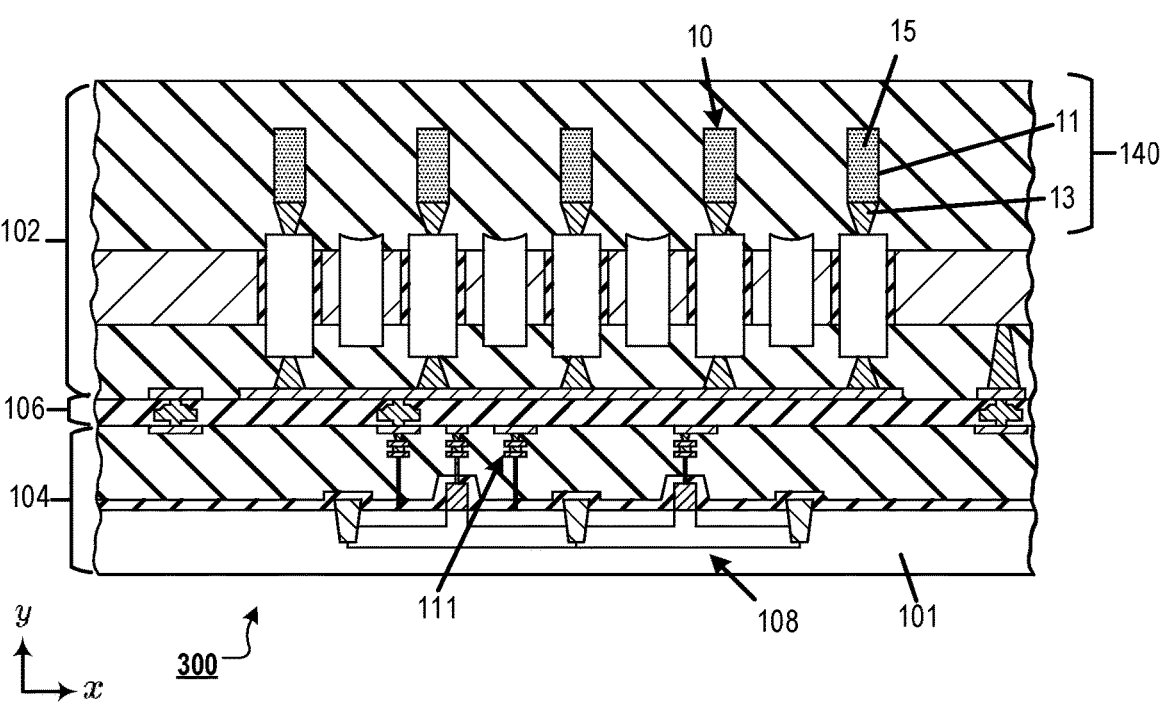

FIG. 3C shows a third stage in formation of the memory device 300 that includes removing the top surface of the first wafer 102 to expose the first holes 11, i.e., removing the carrier wafer 52 portion of first wafer 102. For example, carrier wafer 52 can be removed from first wafer 102 by chemical mechanical processing (CMP) or other suitable method.

Following one or more high-temperature processes, the sacrificial material 12 is removed from the first holes 11 and/or the semiconductor structure 140 to expose the first electrodes 13. The high-temperature processes can be implemented at any stage of the fabrication process before the sacrificial material 12 is removed. The high-k dielectric material is then deposited on the first electrodes 13 to form an isolation layer 15.

Since the high-k material is not exposed to any high-temperature processes throughout the fabrication method, the crystal structure and phase of the high-k material does not change. In general, the high-k material will have a higher dielectric constant and a smaller average crystal size than if the same material were exposed to any of the high-temperature processes. For example, the high-k material included in the final capacitor structures 10 can have a dielectric constant of about 5 or more (e.g., about 5.5 or more, about 6 or more, about 6.5 or more, about 7 or more). In some implementations, the high-k material can have a dielectric constant of about 20 or more. In some implementations, the high-k material can have a dielectric constant of about 25 or more. For example, the high-k material can have a dielectric constant in a range of about 25 to 40. The high-k material can also satisfy one or more dimensional conditions based on the absolute and/or relative sizes of its crystals. Particularly, a smallest crystal of the high-k material corresponds to a minimum dimension d and a largest crystal of the high-k material corresponds to a maximum dimension D. In some implementations, a quantity of large crystals over a total quantity of crystals in the high-k material has a percentage less than 20%, where the large crystals have dimensions between $$\frac{2}{3}(d + D)$$

and D. In other implementations, the quantity of large crystals over the total quantity of crystals in the high-k material has a percentage less than 15%, where the large crystals have dimensions between $$\frac{3}{4}(d + D)$$

and D. In further implementations, an average dimension of total crystals in the high-k material is between d and $$\frac{1}{2}(d + D).$$

Figure 3D:
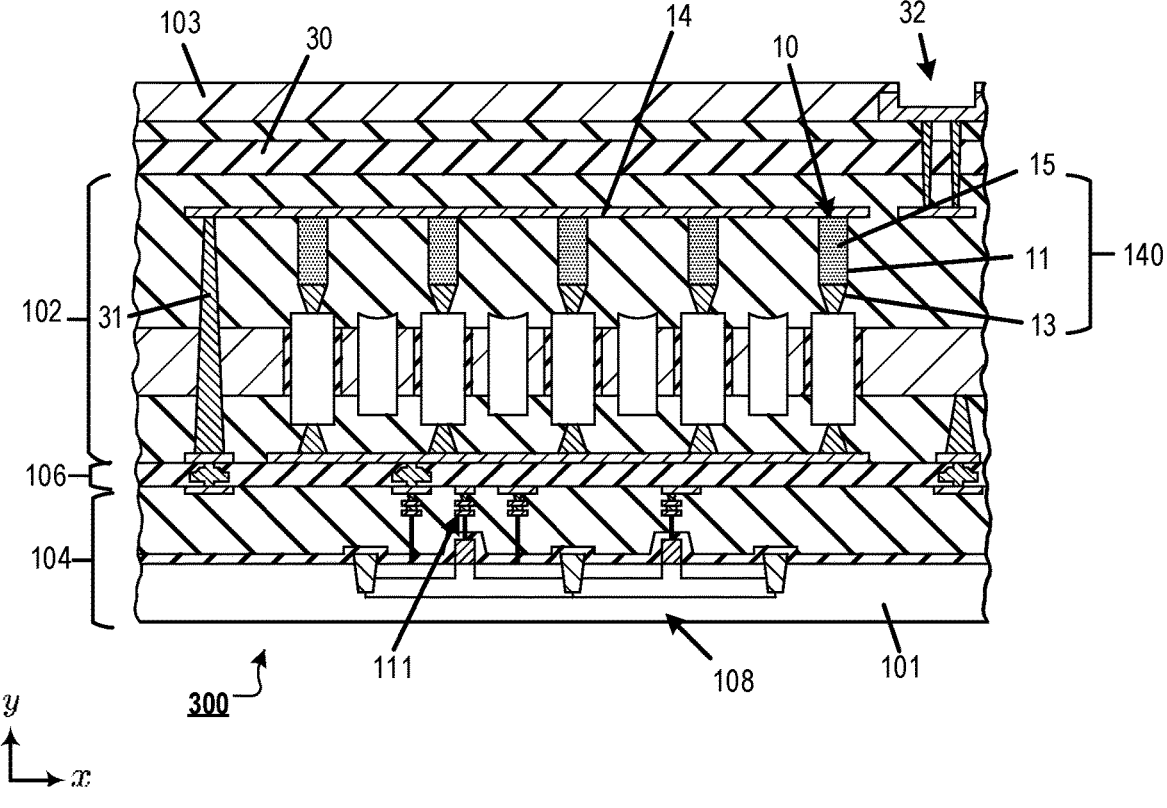

FIG. 3D shows a fourth stage in formation of the memory device 300 that may include additional fabrication steps that can be performed to generate a final memory architecture. The second electrodes 14 are formed on the isolation layer 15 to generate the final vertical capacitors 10, that is, capacitors 10 each having a first electrode 13 and a second electrode 14 separated by an isolation layer 15. The isolation layer 15 insulates first electrodes 13 and second electrodes 14 from each other. The second electrodes 14 can be composed of any suitable conducting material, e.g., TiN and/or silicon-germanium (SiGe). Second electrodes 14 may be grounded in some implementations.

A conductive layer 30 can be deposited on the second electrodes 14 and/or the semiconductor structure 140. Deposition of the conductive layer 30 can include forming a contact 31 between the bonding interface 106 to communicate with the peripheral circuits 108 of second wafer 104. The conductive layer 30 and contact 31 can include any suitable conductive material, including but not limited to, W, Co, Cu, Al, silicides, or any combination thereof. Alternatively or in addition, a pad-out interconnect layer 103 can be deposited on the conductive layer 30 (or one or more layers disposed on the conductive layer 30) for pad-out purposes, i.e., interconnecting with external devices using contact pads 32 on which bonding wires can be soldered.

In general, deposition of the first electrodes 13, the sacrificial material 12, the isolation layer 15, the second electrodes 14, the conductive layer 30, the pad-out interconnect layer 103 and/or other material layers can be performed with any suitable deposition method, e.g., chemical vapor deposition (CVD), physical vapor deposition (PVD), plasma-enhanced CVD (PECVD), low pressure CVD (LPCVD), metal-organic CVD (MOCVD), sputtering, atomic layer deposition (ALD), or combinations thereof.

FIG. 4A shows a flow diagram of an example process 400 for fabricating a memory device including capacitors. The process 400 generally involves one or more high-temperature processes. Each capacitor includes a first electrode and a second electrode separated by an isolation layer. The isolation layer generally includes a high-k dielectric material, e.g., $Al_2O_3$, $HfO_2$, $ZrO_2$, $TiO_2$, or combinations thereof.

Process 400 includes providing a first semiconductor wafer. The first wafer includes a sacrificial material and the first electrodes that are disposed in an array of first holes. The first electrodes are in contact with the sacrificial material (410).

Process 400 includes hybrid bonding the first wafer to a second semiconductor wafer that includes a CMOS device (e.g., peripheral circuitry) (420). In general, hybrid bonding involves one or more high-temperature processes.

Process 400 includes removing the sacrificial material to expose the first electrodes (430).

Process 400 includes depositing the isolation layer on the first electrodes (440).

Process 400 includes forming the second electrodes on the isolation layer (450).

In some implementations, process 400 includes depositing a conductive layer on the second electrodes and forming a pad-out structure connected to the conductive layer and the CMOS device (460).

FIG. 4B shows a flow diagram of an example process 410 for providing a first semiconductor wafer.

Process 410 includes providing an array wafer including a sacrificial material and first electrodes disposed in an array of first holes. The first electrodes are in contact with the sacrificial material (412).

Process 410 includes forming the first semiconductor wafer by bonding the array wafer with a carrier wafer and thinning the array wafer (414). A top surface of array wafer is bonded to a bottom surface of carrier wafer and a bottom surface of array wafer is thinned and/or polished.

In some implementations, process 410 includes heat treating the first wafer (416). For example, the heat treatment can be used to form one or more components of a memory device, e.g., bit lines.

FIG. 4C shows a flow diagram of an example process 420 for hybrid bonding the first semiconductor wafer of process 410 with a second semiconductor wafer that includes a CMOS device.

Process 420 includes hybrid bonding the array wafer with the second wafer (422). The thinned bottom surface of the array wafer portion of first wafer is bonded to a top surface of second wafer at a bonding interface.

Process 420 includes removing the carrier wafer from the first wafer to expose the array wafer (424).

FIG. 5A is a top view depicting an example of a processed first wafer 102 for use in fabricating a memory device having vertical capacitors. Each capacitor of the resultant memory device includes a first electrode and a second electrode separated by an isolation layer. The steps to produce such capacitors are explained below. FIG. 5B is a cross-sectional view of the example first semiconductor wafer 102. The first wafer 102 can be used to fabricate at least two different capacitor structures, referred to herein as "pillar capacitors" and "cup capacitors", involving one or more high-temperature processes. FIGS. 6A-6L outline steps for fabricating pillar capacitors for a memory device starting from first wafer 102. FIGS. 7A-7E outline steps for fabricating cup capacitors for a memory device starting from first wafer 102.

The first wafer 102 includes a transistor array region 150 that includes multiple vertical transistors 210. Vertical transistors 210 are provided in the form of semiconductor bodies 124 and a gate structure that includes a gate dielectric 126 and a gate electrode 114. The semiconductor bodies 124 are separated by dielectric material 130 (in some cases air gaps), which can electrically isolate adjacent vertical transistors 210.

The first wafer 102 also includes an array of first holes 11 penetrating vertically through a semiconductor structure 140 disposed above the transistor array region 150. The first holes 11 correspond to structures of the resulting vertical capacitors. Contacts 20 interface the first holes 11 with the semiconductor bodies 124, e.g., such that bits stored in the resultant capacitors can be selected and/or switched by the vertical transistors 210. The semiconductor structure 140 includes alternating layers of a first dielectric material 41 and a second dielectric material 42. In this example, the alternating layers include two layers of the first dielectric material 41-1 and 41-2 and three layers of the second dielectric material 42-1, 42-2 and 42-3. In general, any number of layers can be included in semiconductor structure 140 and more than two dielectric materials can be utilized for the layers if desired. In this example, the first dielectric material 41 and the second dielectric material 42 are different materials and can include any suitable dielectric material such as silicon oxide ($SiO_2$) or silicon nitride ($Si_3N_4$).

FIG. 6A is a top view showing a first stage in formation of a memory device 600 (which can be operationally and/or structurally similar to the memory device 100, the memory device 200, and/or memory device 300) having pillar capacitors. FIG. 6B is a cross-sectional view showing the first stage. The first stage includes forming the first electrodes 13 (e.g., TiN) in the first holes 11 and filling the first holes 11 with a filling material 16 (e.g., polysilicon, a dielectric material). The filling material 16 is also deposited on the top layer of second dielectric material 42-1 to adequately conceal first electrodes 13. In this case, the first electrodes 13 line the first holes 11 and are recessed to establish a relatively uniform material layer within the first holes 11, but can otherwise fill the first holes 11 in different ways. For example, the first electrodes 13 can partially line or partially fill the first holes 11 depending on the configuration of the vertical capacitors. Different first holes 11 can also be filled differently as desired. Moreover, in this implementation, the sacrificial material 12 is included in the semiconductor structure 140 and the filling material 16 is generally a different material from the sacrificial material 12. More particularly, the first dielectric material 41 is the sacrificial material 12 such that multiple layers of sacrificial material 12-1 and 12-2 are included in the semiconductor structure 140. As is described below, the sacrificial layers 12-1 and 12-2 can be patterned and subsequently removed following one or more high-temperature processes to generate pillar capacitors while simultaneously avoiding high-k dielectric failure.

Figure 6C:
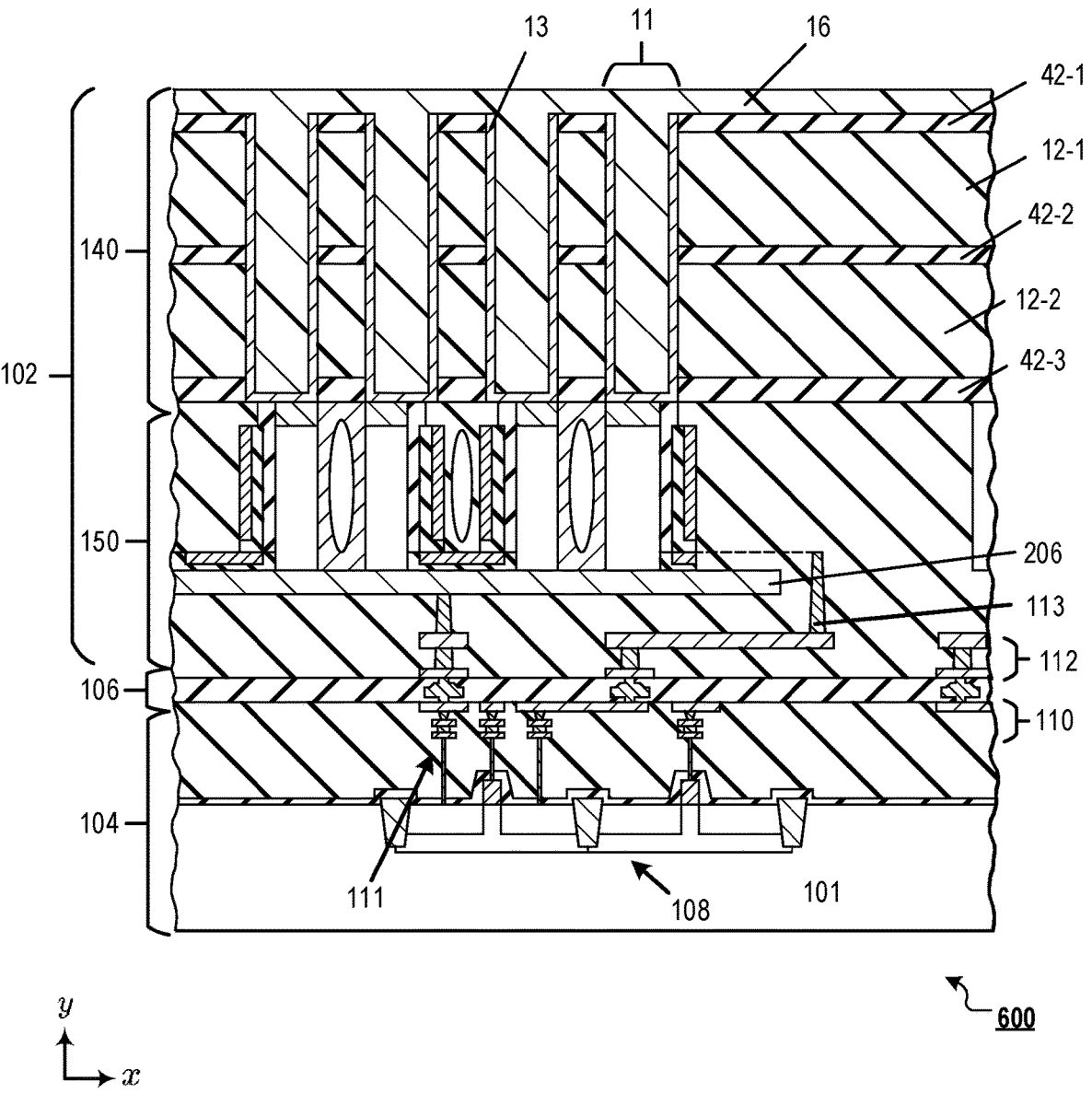

FIG. 6C is a cross-sectional view showing a second stage in formation of the memory device 600 having pillar capacitors. The second stage includes hybrid bonding the first wafer 102 with a second wafer 104 at a bonding interface 106. Hybrid bonding generally involves one or more high-temperature processes. Additional high-temperature processes and heat treatments can be performed before and/or after hybrid bonding, for example, to form various components of the memory device 600 such as bit lines 206. In some implementations, the second stage can include intermediate steps before and/or after the first wafer 102 is hybrid bonded with the second wafer 104. For example, an array wafer can be provided that includes semiconductor structure 140 and transistor array region 150. The array wafer can be bonded to a carrier wafer to form the first wafer 102 and support first wafer 102 during the intermediate steps. The array wafer can be thinned and/or polished to provide a clean interface for hybrid bonding and the carrier wafer can be removed after hybrid bonding to expose the array wafer.

As seen in FIG. 6C, the second wafer 104 includes peripheral circuits 108 (e.g., CMOS technology) embedded in a substrate 101 and connected through the bonding interface 106 by interconnects 111. Second wafer 104 can further include an interconnect layer 110 near bonding interface 106, above the peripheral circuits 108. After hybrid bonding, the first wafer 102 includes interconnects (e.g., bit line contacts) 113 that are connected with interconnects 111 of second wafer 104 through bonding interface 106. First wafer 102 can further include an interconnect layer 112 near bonding interface 106.

Figures 6D, 6E:
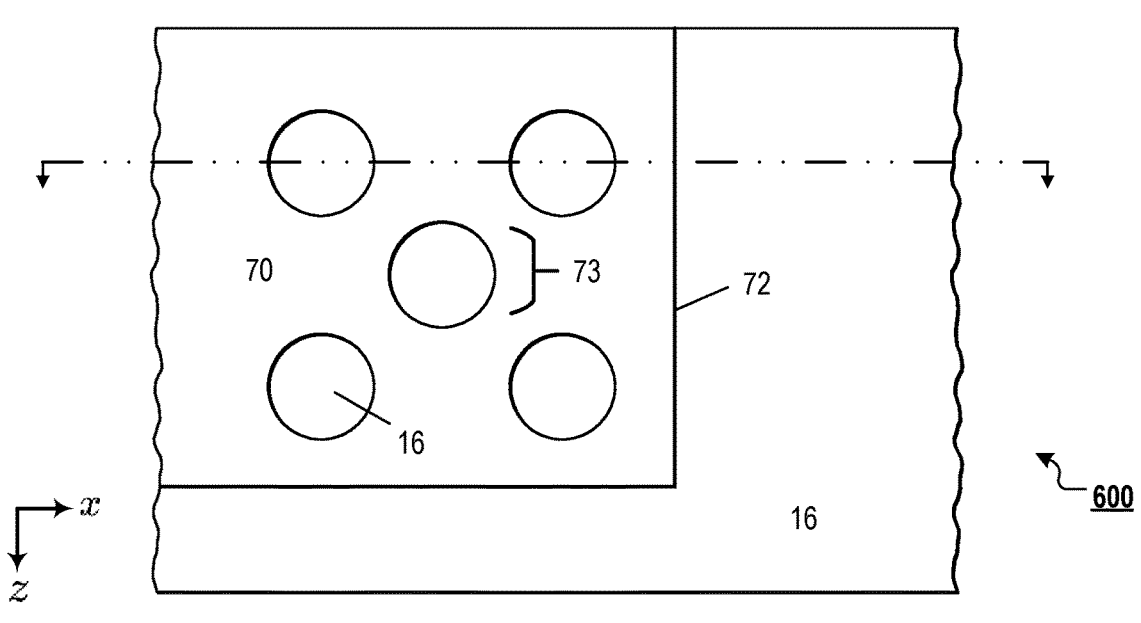

FIG. 6D is a top view showing a third stage in formation of the memory device 600 having pillar capacitors. FIG. 6E is a cross-sectional view showing the third stage. The third stage includes applying a mask 70 on top of the filling material 16 disposed on semiconductor structure 140. The mask 70 can be used to etch features through one or more layers of the semiconductor structure 140. Here, the mask 70 includes circular spacer holes 73 aligned between the first holes 11. The spacer holes 73, as well as a perimeter 72 of the mask 70, can be etched to pattern various features in the semiconductor structure 140. Other mask shapes and/or sizes can also be utilized depending on the particular implementation. For example, square, rectangular, triangular, polygonal, etc. spacer holes and/or perimeters of mask can be implemented depending on a desired patterning.

Figure 6F:
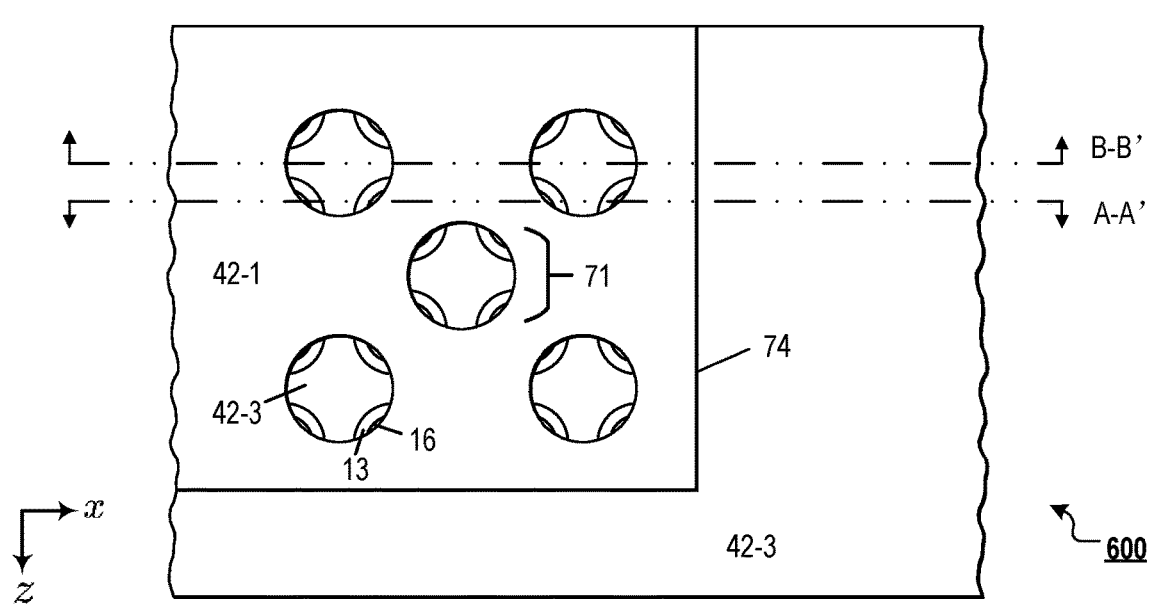
Figure 6G:
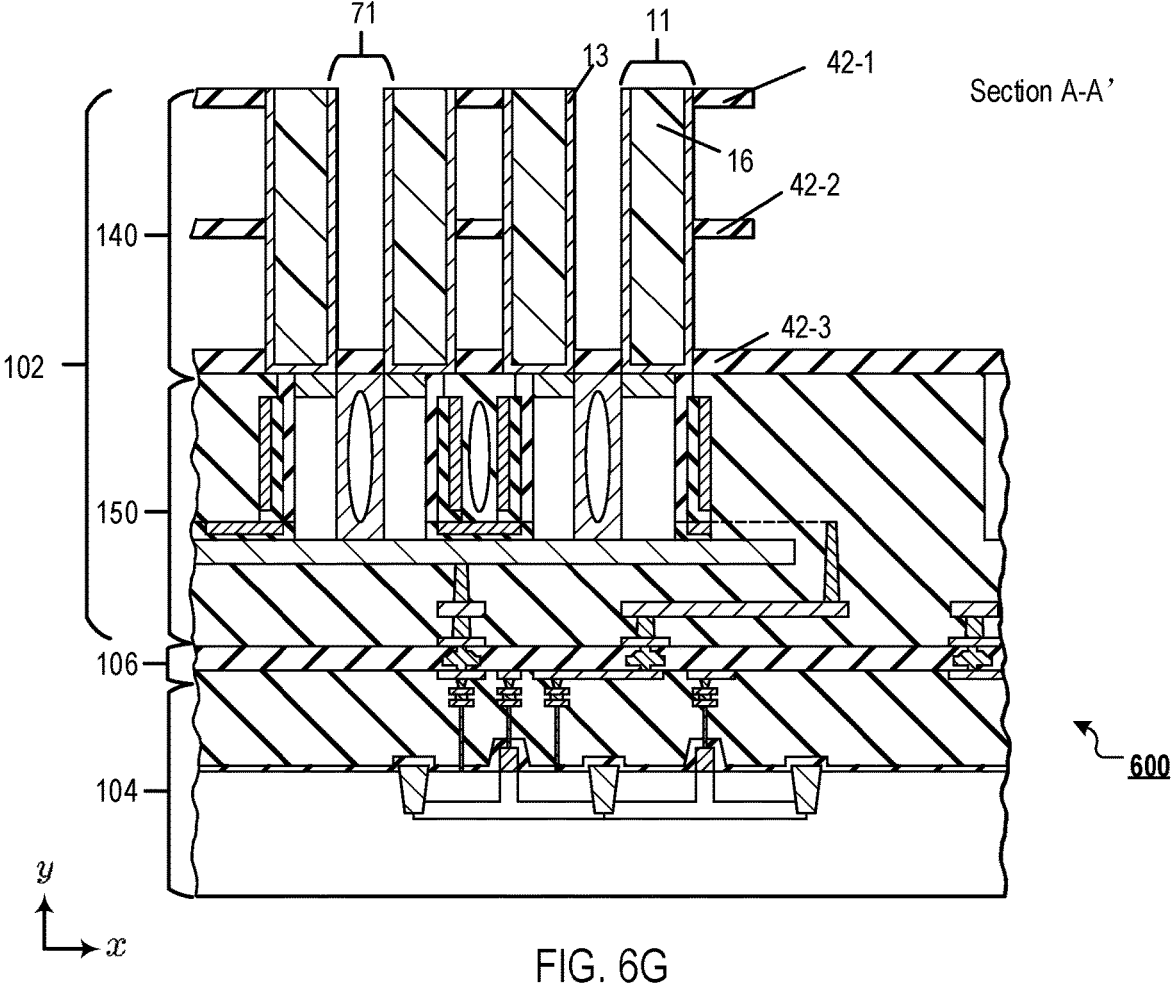
Figure 6H:
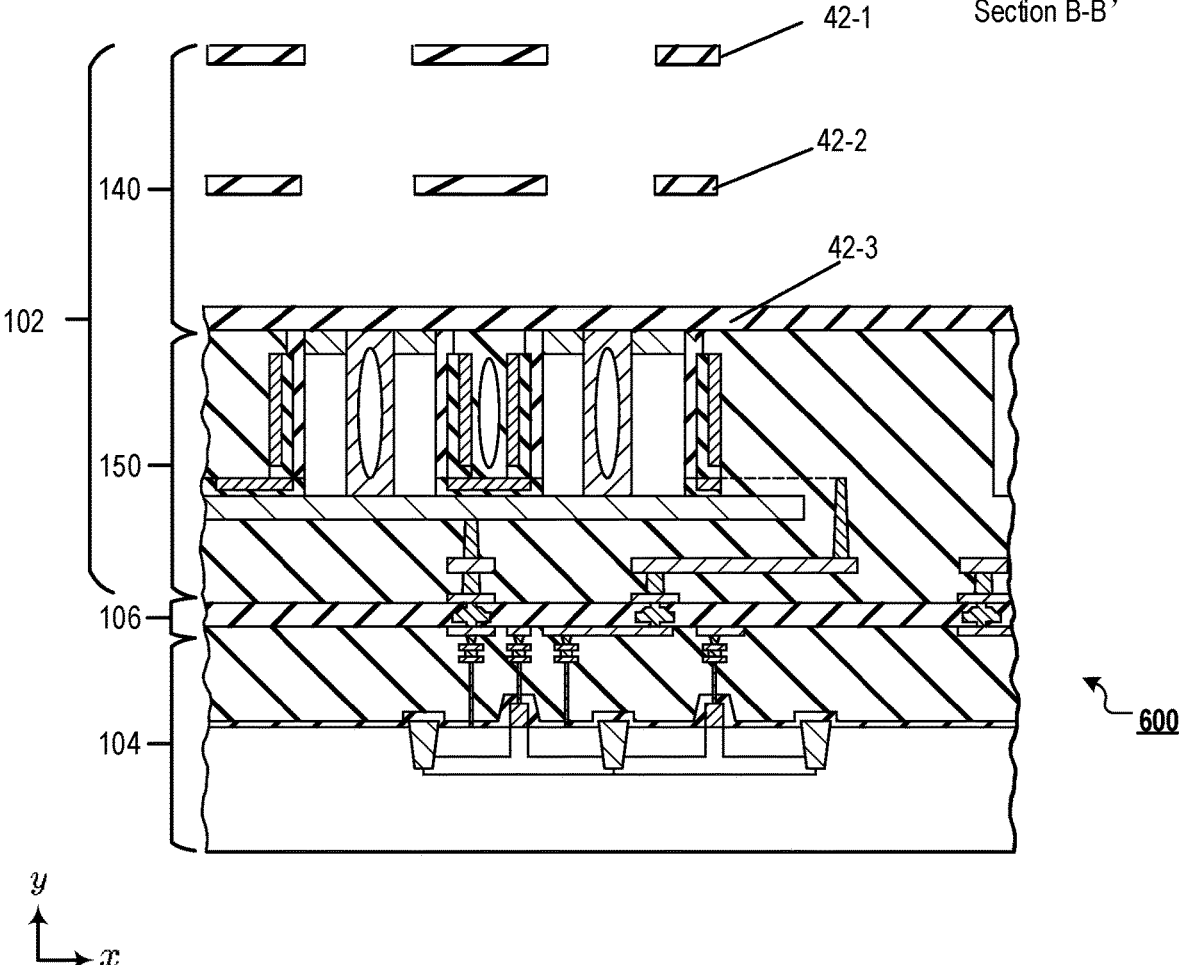

FIG. 6F is a top view showing a fourth stage in formation of the memory device 600 having pillar capacitors. FIG. 6G is a cross-sectional view (section A-A' as shown in FIG. 6F) showing the fourth stage. FIG. 6H is another cross-sectional view (section B-B' as shown in FIG. 6F) showing the fourth stage. The fourth stage includes etching second holes 71 using the spacer holes 73 of mask 70 as a guide. The second holes 71 penetrate through the semiconductor structure 140.

The semiconductor structure 140 is also etched around the first holes 11 along the perimeter 72 of the mask 70 to generate an etched perimeter 74 of semiconductor structure 140. The second holes 71 and perimeter 74 can be etched using any suitable technique, e.g., a dry etching method. In this example, the excess layer of filling material 16 disposed on semiconductor structure 140 is also removed following etching, e.g., using CMP or other suitable method.

In this implementation, all layers of the semiconductor structure 140 are etched besides the bottom layer of the second dielectric material 42-3. However, any number of layers of semiconductor structure 140 can be etched depending on the desired capacitor configuration. For example, in some implementations, only the top layer of first dielectric material 42-1 is etched which alters the resulting structure of the pillar capacitors. Following etching, the layers of sacrificial material 12-1 and 12-2 are removed from the semiconductor structure 140 to expose the first electrodes 13. The sacrificial layers 12-1 and 12-2 can be removed using, for example, a wet etching method or other suitable material removal process. Any excess materials resulting from etching are also removed with the layers of sacrificial material 12-1 and 12-2 to generate the structure of the semiconductor structure 140 shown in FIG. 6G. The sacrificial layers 12-1 and 12-2 can be removed through the second holes 71 etched in any of the layers of first dielectric material 42-1 and 42-2. Alternatively or in addition, the sacrificial layers 12-1 and 12-2 can be removed laterally around the etched perimeter 74 of semiconductor structure 140.

Figure 6I:
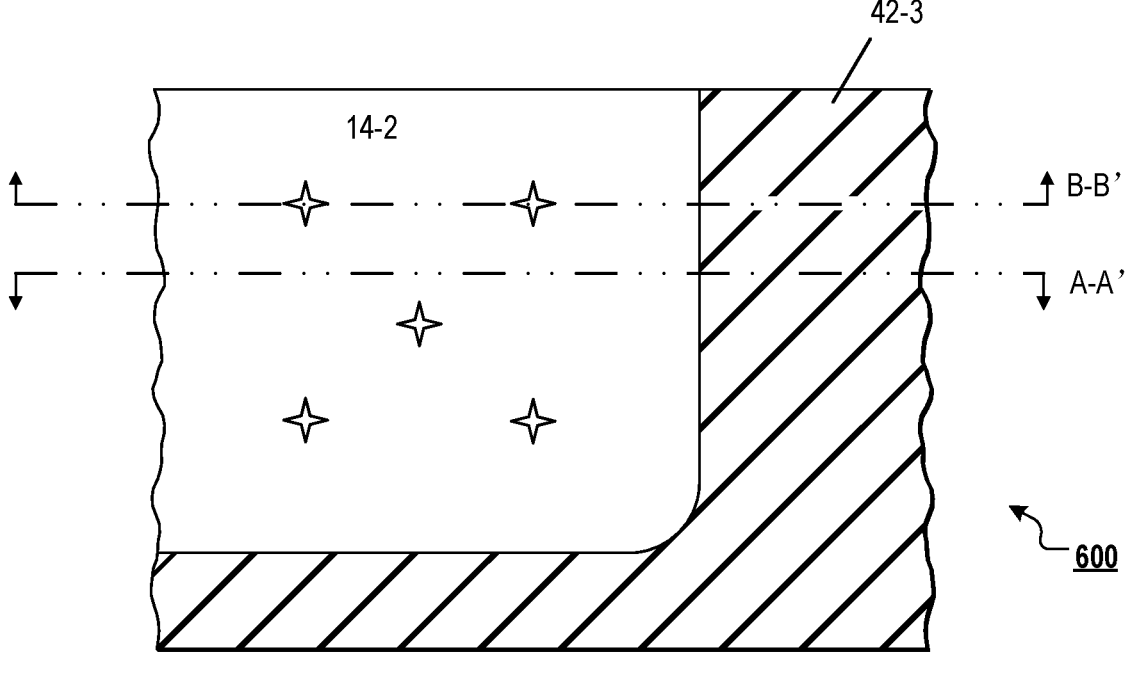
Figure 6J:
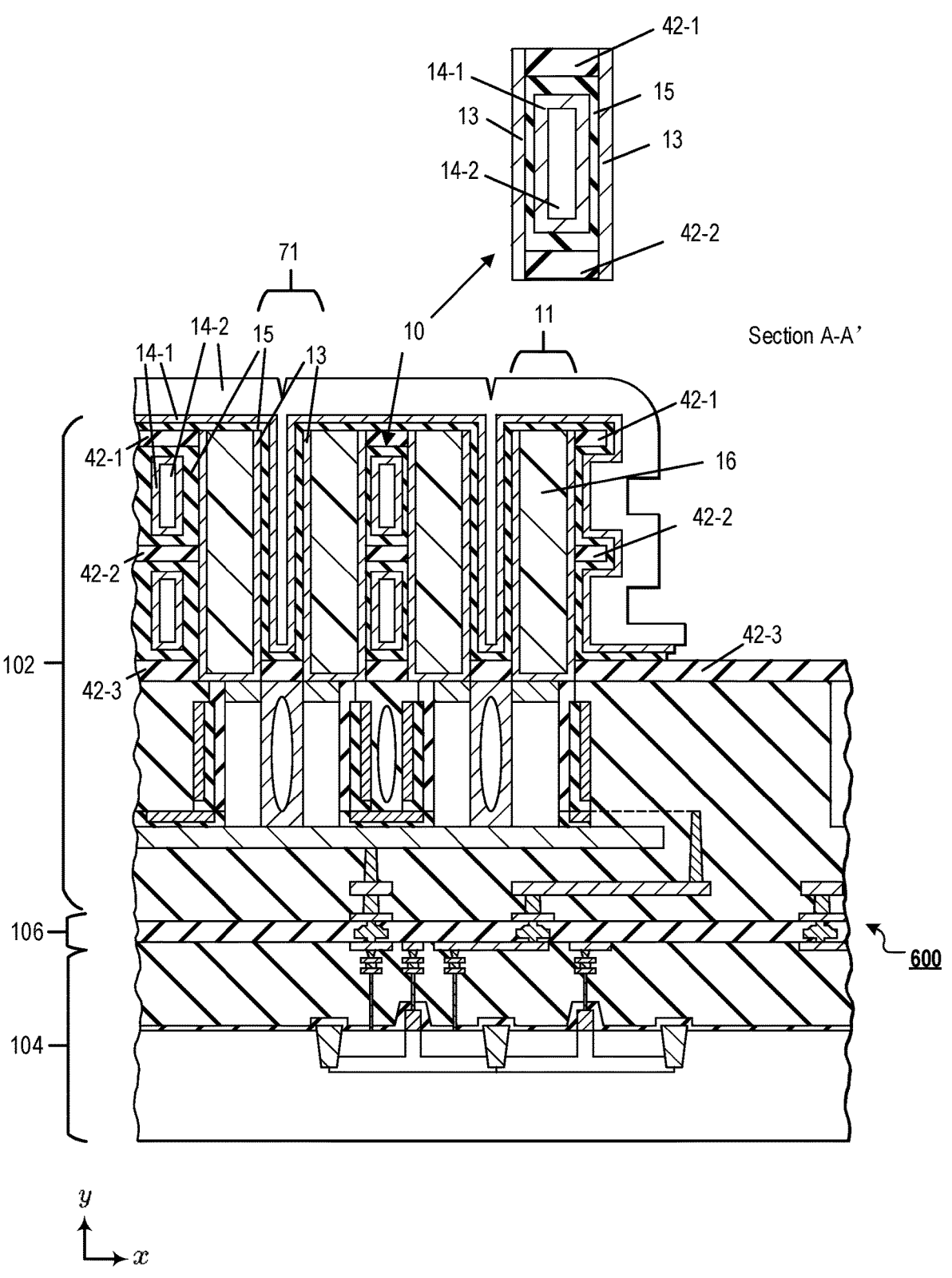
Figure 6K:
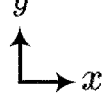

FIG. 6I is a top view showing a fifth stage in formation of the memory device 600 having pillar capacitors. FIG. 6J is a cross-sectional view (section A-A' as shown in FIG. 6I) showing the fifth stage. FIG. 6K is another cross-sectional view (section B-B' as shown in FIG. 6I) showing the fifth stage. The fifth stage includes depositing the isolation layer 15 (e.g., a high-k dielectric material) on the first electrodes 13. In particular, the isolation layer 15 is deposited into the etched second holes 71 on to the first electrodes 13. Alternatively or in addition, the isolation layer 15 can be deposited laterally around the first holes 11 by way of the etched perimeter 74 of semiconductor structure 140. As seen in FIG. 6J, the isolation layer 15 can also be deposited on other exposed surfaces such as the top of the filling material 16 remaining in the first holes 11 and the layers of second dielectric material 42-1, 42-2 and 42-3. In general, all high-temperature processes (e.g., involving temperatures of about 500° C. or more) are completed preceding deposition of the isolation layer 15. Hence, the isolation layer 15 is not exposed to temperatures that could cause high-k material failure or degradation (e.g., altering crystal structure and/or phase of the high-k material) and therefore maintains a relatively high dielectric constant (e.g., a dielectric constant of about 5 or more).

The second electrodes 14 are then formed on the isolation layer 15 in a similar manner, e.g., deposition through the etched second holes 71 and/or laterally by way of the etched perimeter 74. Here, the second electrodes 14 are composed of layers of two different conductive materials 14-1 and 14-2 which can include, e.g., TiN and SiGe, respectively. The second electrodes 14 can also be composed of a single layer of conductive material, e.g., TiN or SiGe. The first electrodes 13 are separated from the second electrodes 14 by the isolation layer 15 thereby forming the pillar capacitors 10. Due to the vertical geometry of the pillar capacitors 10 and the high dielectric constant isolation layer 15, the pillar capacitors 10 are generally of high quality compared with planar capacitors and/or capacitors fabricated using other methods, e.g., having higher capacitance and/or reduced wafer area consumption.

As observed in FIG. 6J, the pillar capacitors 10 have a relatively complex 3D configuration due to various etching procedures, material removal and deposition steps. For example, a pillar capacitor 10 includes a region bounded above and below (vertically) by two layers of the second dielectric material 42-1 and 42-2. The region is bounded left and right (laterally) by two first electrodes 13 of adjacent first holes 11. The isolation layer 15 is supported on a continuous surface subtended by the two layers of the second dielectric material 42-1 and 42-2 and the two first electrodes 13. A shared second electrode 14 occupies a space bounded by the continuous surface, such that conductive material 14-1 is layered on the isolation layer 15 and the conductive material 14-2 fills the remaining space. The pillar capacitor 10 may be interpreted as two capacitors, corresponding to the two first electrodes 13, sharing the second electrode 14 between them.

Figure 6L:
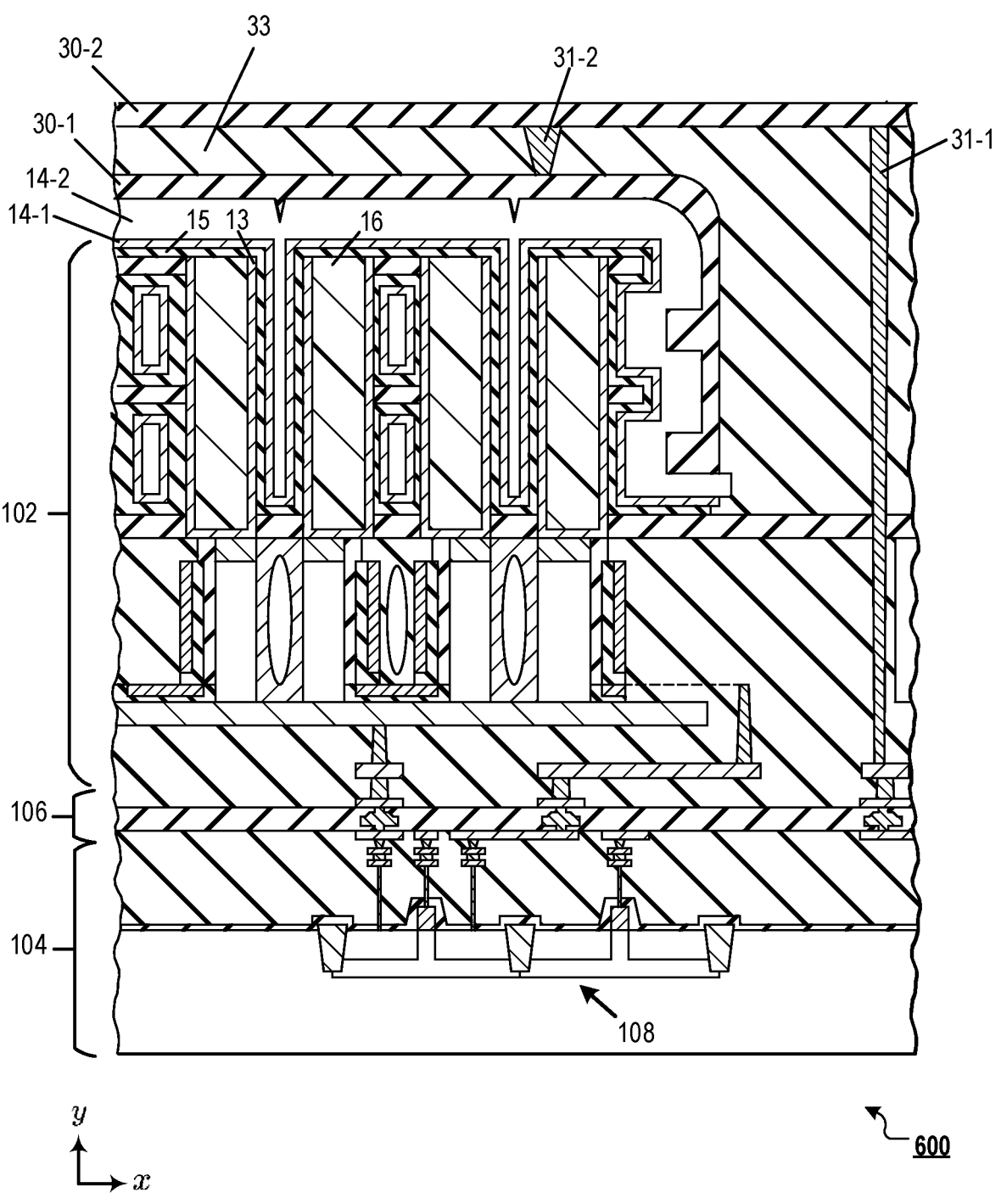

FIG. 6L is a cross-sectional view showing an optional sixth stage in formation of the memory device 600 having pillar capacitors. A first conductive layer 30-1 is deposited on the second electrodes 14 followed by one or more dielectric layers 33 that can include, e.g., silicon oxide, silicon nitride, etc. The first conductive layer 30-1 can interface with the pillar capacitors and the one or more dielectric layers 33 can provide electric insulation for memory device 600. Furthermore, the one or more dielectric layers 33 can fill the dielectric regions of semiconductor structure 140 that were removed via etching during the fourth stage. A second conductive layer 30-2 is deposited on the one or more dielectric layers 33. The second conductive layer 30-2 is connected to the peripheral circuits 108 by a first contact 31-1 through the bonding interface 106. The second conductive layer 30-2 can accommodate a pad-out structure, e.g., including contact pads 32. Alternatively or in addition, a pad-out interconnect layer can be deposited on the second conductive layer 30-2. A second contact 31-2 connects first and second conductive layers 30-1 and the 30-2, e.g., to allow peripheral circuits 108 modulate the pillar capacitors while operating the vertical transistors of memory device 600.

FIG. 7A is a top view showing a first stage in formation of a memory device 700 (which can be operationally and/or structurally similar to the memory device 100, the memory device 200, the memory device 300, and/or the memory device 600) having cup capacitors. FIG. 7B is a cross-sectional view showing the first stage. The first stage includes forming the first electrodes 13 (e.g., TiN) in the first holes 11 and filling the first holes 11 with a sacrificial material 12 (e.g., carbon) to cover the first electrodes 13 (at least partially). In this example, the sacrificial material 12 generally provides support for structures of the resultant cup capacitor throughout the fabrication process, particularly during one or more high-temperature processes. Similar to the pillar capacitors described in FIGS. 6A-6L, the first electrodes 13 line the first holes 11 and are recessed to establish a relatively uniform material layer with the first holes 11, but can otherwise fill the first holes 11 in different ways. Converse to the pillar capacitors, in this implementation, the semiconductor structure 140 is not composed of sacrificial material 12. Here, the semiconductor structure 140 can be a single material and the layers of first and second dielectric materials 41 and 42 can be the same material if desired.

Figure 7C:
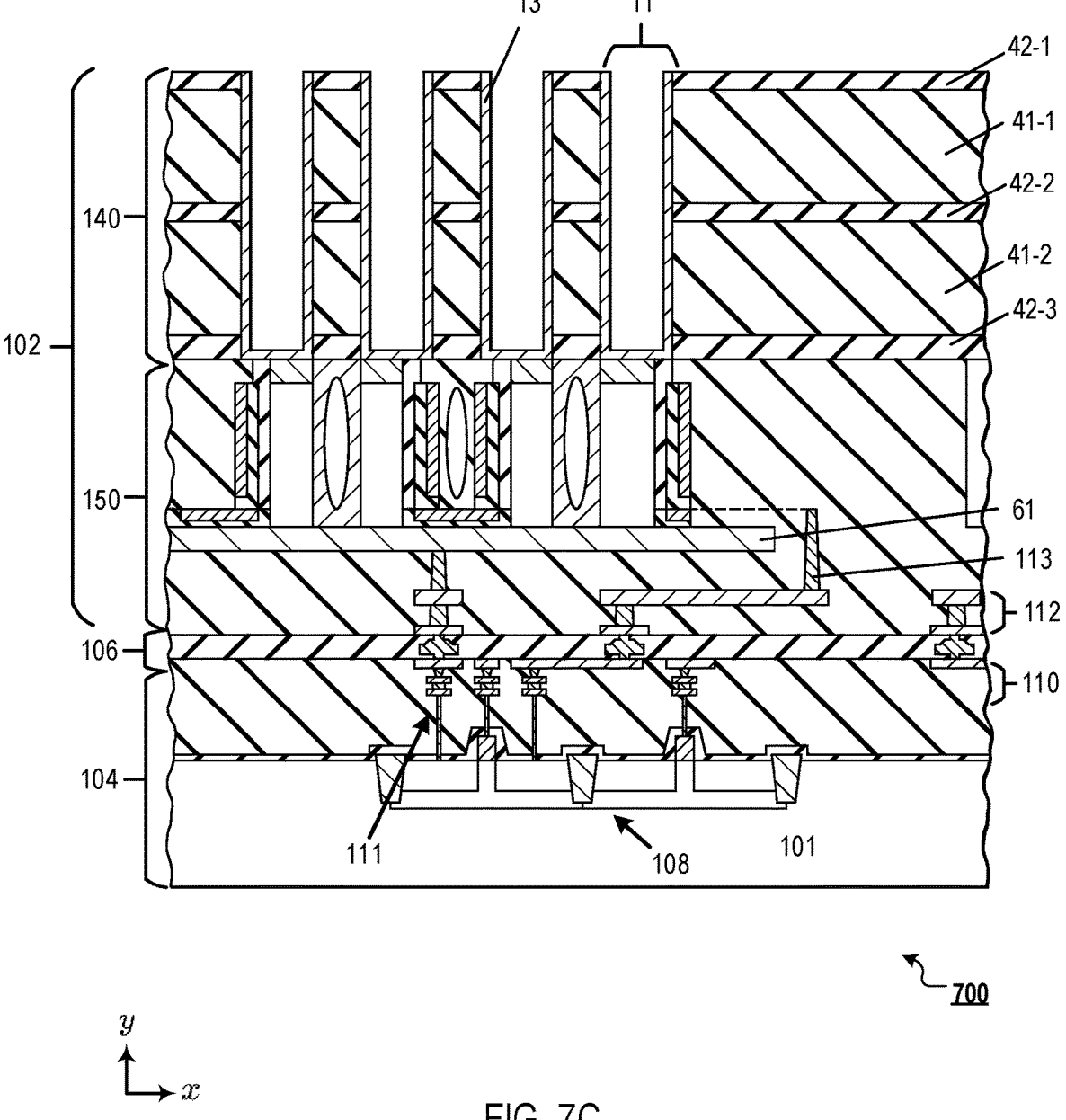

FIG. 7C is a cross-sectional view showing a second stage in formation of the memory device 700 having cup capacitors. The second stage includes hybrid bonding the first wafer 102 with a second wafer 104 at a bonding interface 106. Hybrid bonding generally involves one or more high-temperature processes. Additional high-temperature processes and heat treatments can be performed before and/or after hybrid bonding, for example, to form various components of the memory device 700 such as bit lines 206.

The second wafer 104 includes peripheral circuits 108 (e.g., CMOS technology) embedded in a substrate 101 and connected through the bonding interface 106 by interconnects 111. Second wafer 104 can further include an interconnect layer 110 at bonding interface 106, above the peripheral circuits 108. After hybrid bonding, the first wafer 102 includes interconnects (e.g., bit line contacts) 113 that are connected with interconnects of second wafer 104 at bonding interface 106. First wafer 102 can further include an interconnect layer 112 near bonding interface 106.

Figure 7D:
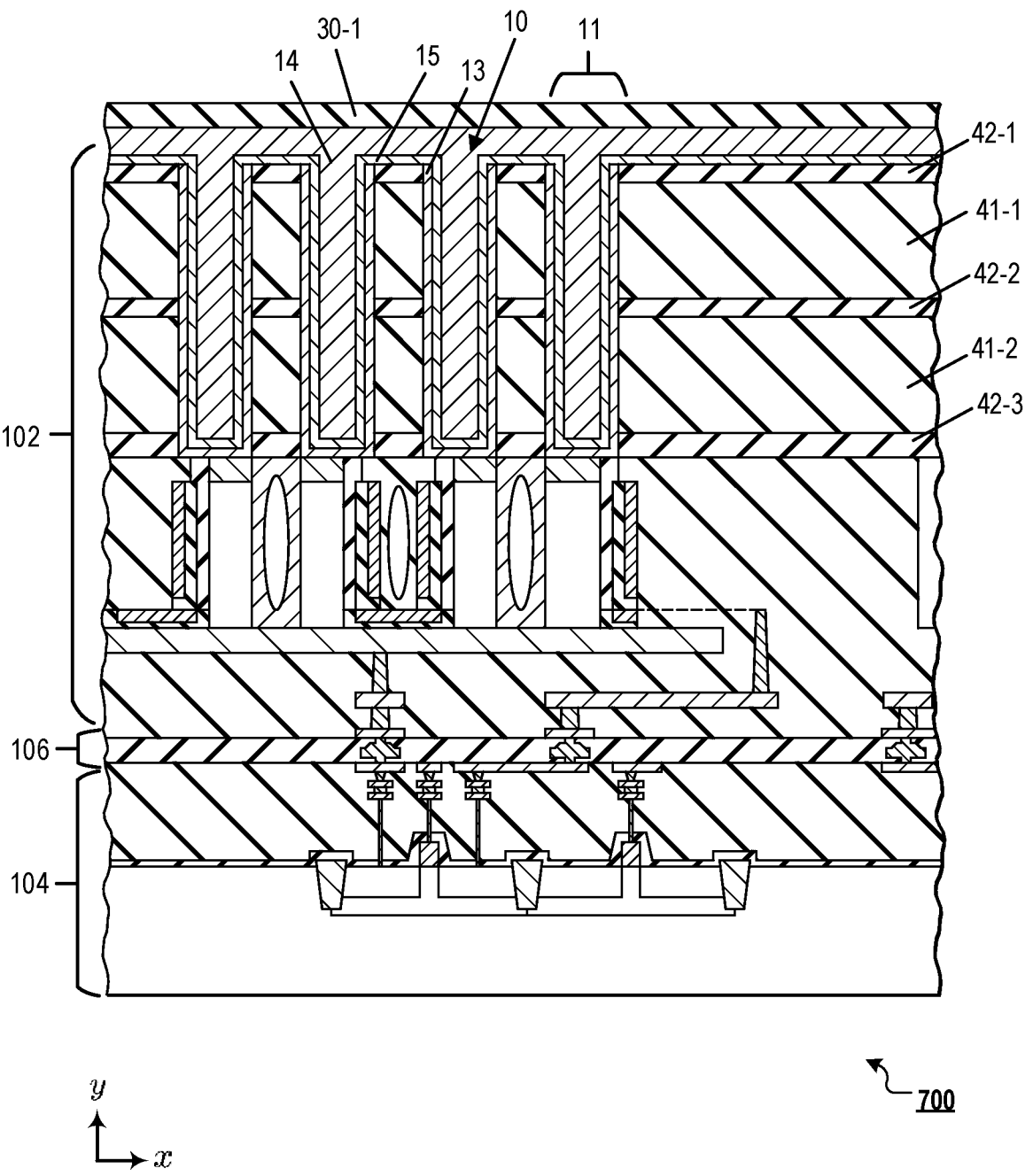

FIG. 7D is a cross-sectional view showing a third stage in formation of the memory device 700 having cup capacitors. Following one or more high-temperature processes, the third stage includes removing the sacrificial material 12 from the first holes 11 to expose the first electrodes 13. The sacrificial material 12 can be removed, for example, using an asher method or other suitable material removal process. The sacrificial material 12 can include carbon, silicon oxide, silicon nitride and other materials different from the first electrodes 13. The isolation layer 15 (e.g., a high-k dielectric material) is then deposited into the first holes 11 on the first electrodes 13. In this example, the isolation layer 15 is also deposited on the semiconductor structure 140. The isolation layer 15 is not exposed to high-temperature processes that could cause high-k material failure or degradation (e.g., altering crystal structure and/or phase of the high-k material) and therefore maintains a relatively high dielectric constant (e.g., a dielectric constant of about 5 or more).

The third stage further includes forming the second electrodes 14 (e.g., TiN) on the isolation layer 15. The second electrodes 14 fill the first holes 11 and form a layer over the portion of isolation layer 15 that is disposed on the semiconductor structure 140. The first electrodes 13 are separated from the second electrodes 14 by the isolation layer 15 thereby forming the cup capacitors 10. Due to the vertical geometry of the cup capacitors 10 and the high dielectric constant isolation layer 15, the cup capacitors 10 are generally of high quality compared with planar capacitors and/or capacitors fabricated using other methods, e.g., having higher capacitance and/or reduced wafer area consumption. A first conductive layer 30-1 is then deposited on the second electrodes 14, e.g., to interface with the cup capacitors 10.

Figure 7E:
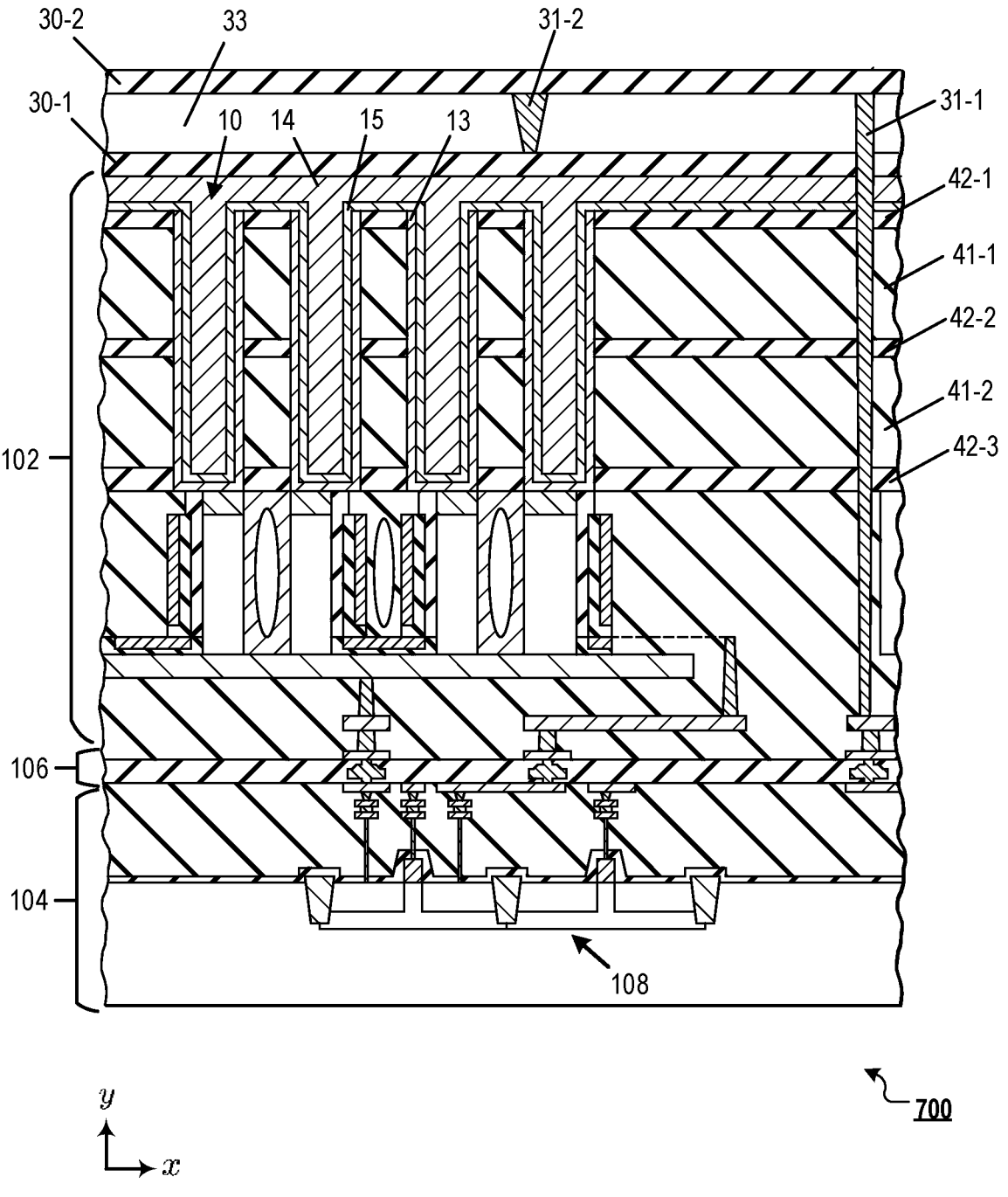

FIG. 7E is a cross-sectional view showing a fourth stage in formation of the memory device 700 having cup capacitors. The fourth stage includes depositing one or more dielectric layers 33 on the first conductive layer 30-1, e.g., to provide electrical insulation for memory device 700. A second conductive layer 30-2 is deposited on the one or more dielectric layers 33. The second conductive layer 30-2 is connected to the peripheral circuits 108 by a first contact 31-1 through the bonding interface 106. The second conductive layer 30-2 can accommodate a pad-out structure. Alternatively or in addition, a pad-out interconnect layer can be deposited on the second conductive layer 30-2. A second contact 31-2 connects first and second conductive layers 30-1 and the 30-2, e.g., to allow peripheral circuits 108 modulate the cup capacitors 10 while operating the vertical transistors of memory device 700.

Figure 8:
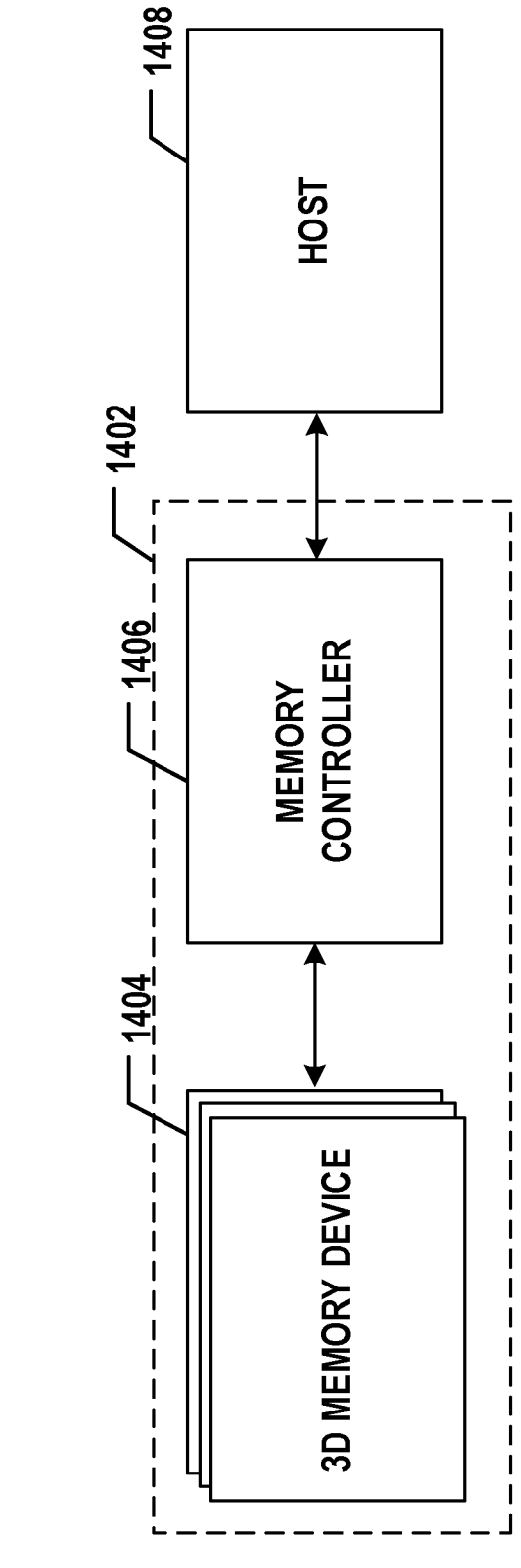
FIG. 8 is a block diagram depicting an example of a system including one or more memory devices and a memory controller.

FIG. 8 illustrates a block diagram of an example system 1400 including one or more memory devices. System 1400 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 8, system 1400 can include a host 1408 and a memory system 1402 having one or more memory devices 1404 and a memory controller 1406. Host 1408 can be a processor of an electronic device, such as a central processing unit (CPU), or a system-on-chip (SoC), such as an application processor (AP). Host 1408 can be configured to send or receive data to or from memory devices 1404.

The memory devices 1404 can be any combination of memory devices disclosed herein, such as NAND flash memory devices, NOR flash memory devices, phase change memory (PCM) devices, resistive memory devices, RAM devices, DRAM devices, RRAM devices, magnetic memory devices, spin transfer torque (STT) memory devices, among others. Such memory devices can be fabricated with superior quality capacitors (e.g., increased capacitance) using the methods described in the present disclosure. In some implementations, each memory device 1404 includes a DRAM device. Memory controller 1406 (a.k.a., a controller circuit) is coupled to memory device 1404 and host 1408 and is configured to control memory device 1404. For example, the controller circuit may be configured to operate the memory cells of the memory devices 1404 via word lines and/or bit lines. Memory controller 1406 can manage the data stored in memory device 1404 and communicate with host 1408.

Described implementations of the subject matter can include one or more features, alone or in combination.

For example, in a first implementation, a method of fabricating a memory device comprising capacitors, wherein each capacitor comprises a first electrode and a second electrode separated by an isolation layer, includes: providing a first wafer comprising: a sacrificial material; and the first electrodes disposed in first holes and in contact with the sacrificial material; hybrid bonding the first wafer with a second wafer comprising a complementary metal-oxide-semiconductor (CMOS) device; removing the sacrificial material to expose the first electrodes; depositing the isolation layer on the first electrodes; and forming the second electrodes on the isolation layer.

The foregoing and other described implementations can each, optionally, include one or more of the following features:

A first feature, combinable with any of the following features, wherein providing the first wafer comprises: providing an array wafer comprising: the sacrificial material; and the first holes; forming the first wafer comprising the array wafer and a carrier wafer, wherein forming the first wafer comprises: bonding the array wafer with the carrier wafer; and thinning the array wafer, and wherein hybrid bonding the first wafer with the second wafer comprises: hybrid bonding the array wafer with the second wafer; and removing the carrier wafer from the first wafer to expose the array wafer.

A second feature, combinable with any of the previous or following features, further comprising: depositing a conductive layer on the second electrodes; and forming a pad-out structure connected to the conductive layer and the CMOS device.

A third feature, combinable with any of the previous or following features, wherein the first wafer comprises a semiconductor structure comprising alternating layers of the sacrificial material and dielectric material, and wherein the sacrificial material and the dielectric material are different dielectric materials, and the first holes penetrate through the alternating layers.

A fourth feature, combinable with any of the previous or following features, wherein removing the sacrificial material to expose the first electrodes comprises: forming second holes penetrating into the alternating layers between the first holes; and removing the layers of sacrificial material to expose the first electrodes.

A fifth feature, combinable with any of the previous or following features, wherein depositing the isolation layer on the first electrodes comprises: depositing the isolation layer into the second holes and around the first holes, wherein the isolation layer is deposited on the first electrodes, on the layers of dielectric material, and on a filling material comprised in the first holes.

A sixth feature, combinable with any of the previous or following features, wherein: the sacrificial material comprises silicon oxide ($SiO_2$) and the dielectric material comprises silicon nitride ($Si_3N_4$); or the sacrificial material comprises $Si_3N_4$ and the dielectric material comprises $SiO_2$.

A seventh feature, combinable with any of the previous or following features, wherein providing the first wafer comprises: filling the first holes with a filling material to conceal the first electrodes, wherein the sacrificial material and the filling material are different materials.

An eighth feature, combinable with any of the previous or following features, wherein the first wafer comprises a semiconductor structure comprising the first holes, and wherein providing the first wafer comprises filling the first holes with the sacrificial material to conceal the first electrodes.

An ninth feature, combinable with any of the previous or following features, wherein depositing the isolation layer on the first electrodes comprises: depositing the isolation layer into the first holes on the first electrodes.

A tenth feature, combinable with any of the previous or following features, wherein the sacrificial material comprises carbon.

An eleventh feature, combinable with any of the previous or following features, wherein the isolation layer comprises at least one of aluminum oxide, hafnium oxide, or zirconium oxide.

A twelfth feature, combinable with any of the previous or following features, wherein the first electrodes comprise titanium nitride (TiN).

A thirteenth feature, combinable with any of the previous or following features, wherein the second electrodes comprise TiN and silicon-germanium (SiGe).

In a second implementation, a method of fabricating a memory device comprising capacitors, wherein each capacitor comprises a first electrode and a second electrode separated by an isolation layer, includes: providing a first wafer comprising: a sacrificial material; and the first electrodes disposed in first holes and in contact with the sacrificial material; heat treating the first wafer; removing the sacrificial material to expose the first electrodes; depositing the isolation layer on the first electrodes; and forming the second electrodes on the isolation layer.

The foregoing and other described implementations can each, optionally, include one or more of the following features.

A first feature, combinable with any of the following features, wherein providing the first wafer comprises: providing an array wafer comprising: the sacrificial material; and the first holes; forming the first wafer comprising the array wafer and a carrier wafer, wherein forming the first wafer comprises: bonding the array wafer with the carrier wafer; and thinning the array wafer; and hybrid bonding the first wafer with a second wafer comprising a complementary metal-oxide-semiconductor (CMOS) device, wherein hybrid bonding the first wafer with the second wafer comprises: hybrid bonding the array wafer with the second wafer; and removing the carrier wafer from the first wafer to expose the array wafer.

A second feature, combinable with any of the previous or following features, further comprising: depositing a conductive layer on the second electrodes; and forming a pad-out structure connected to the conductive layer and the CMOS device.

A third feature, combinable with any of the previous or following features, wherein the first wafer comprises a semiconductor structure comprising alternating layers of the sacrificial material and dielectric material, wherein the sacrificial material and the dielectric material are different dielectric materials, and wherein the first holes penetrate through the alternating layers.

A fourth feature, combinable with any of the previous or following features, wherein removing the sacrificial material to expose the first electrodes comprises: forming second holes between the first holes, the second holes penetrating through the alternating layers; and removing the layers of sacrificial material to expose the first electrodes.

A fifth feature, combinable with any of the previous or following features, wherein depositing the isolation layer on the first electrodes comprises: depositing the isolation layer into the second holes and around the first holes, wherein the isolation layer is deposited on the first electrodes, on the layers of dielectric material, and on a filling material comprised in the first holes.

A sixth feature, combinable with any of the previous or following features, wherein: the sacrificial material comprises silicon oxide ($SiO_2$) and the dielectric material comprises silicon nitride ($Si_3N_4$); or the sacrificial material comprises $Si_3N_4$ and the dielectric material comprises $SiO_2$.

A seventh feature, combinable with any of the previous or following features, wherein providing the first wafer comprises: filling the first holes with a filling material to conceal the first electrodes, wherein the sacrificial material and the filling material are different materials.

An eighth feature, combinable with any of the previous or following features, wherein the first wafer comprises a semiconductor structure comprising the first holes, and wherein providing the first wafer comprises filling the first holes with the sacrificial material to conceal the first electrodes.

A ninth feature, combinable with any of the previous or following features, wherein depositing the isolation layer on the first electrodes comprises: depositing the isolation layer on the semiconductor structure and into the first holes on the first electrodes.

A tenth feature, combinable with any of the previous or following features, wherein the sacrificial material comprises carbon.

An eleventh feature, combinable with any of the previous or following features, wherein the isolation layer comprises at least one of aluminum oxide, hafnium oxide, or zirconium oxide.

A twelfth feature, combinable with any of the previous or following features, wherein the first electrodes comprise titanium nitride (TiN).

A thirteenth feature, combinable with any of the previous or following features, wherein the second electrodes comprise TiN and silicon-germanium (SiGe).

A fourteenth feature, combinable with any of the previous or following features, wherein the heat treating is at a temperature of 500° C. or more.

In a third implementation, a memory device comprises: a first wafer comprising capacitors, wherein each capacitor comprises a first electrode and a second electrode separated by an isolation layer, and wherein the isolation layer comprises a dielectric material having a dielectric constant of 5 or more; and a second wafer comprising a complementary metal-oxide-semiconductor (CMOS) device, wherein the second wafer is hybrid bonded with the first wafer.

The foregoing and other described implementations can each, optionally, include one or more of the following features.

A first feature, combinable with any of the following features, wherein the dielectric material comprises a smallest crystal having a minimum dimension and a largest crystal having a maximum dimension, and wherein crystals in the dielectric material satisfy one or more dimensional conditions comprising at least one of: a percentage of a quantity of large crystals over a total quantity of crystals in the dielectric material is smaller than 20%, wherein the large crystals have dimensions between ⅔ *(the minimum dimension+the maximum dimension) and the maximum dimension; a percentage of a quantity of large crystals over the total quantity of crystals in the dielectric material is smaller than 15%, wherein the large crystals have dimensions between ¾ *(the minimum dimension+the maximum dimension) and the maximum dimension; or an average dimension of crystals in the dielectric material is between the minimum dimension and ½*(the minimum dimension+the maximum dimension).

A second feature, combinable with any of the following features, further comprising two separated layers of material, wherein the capacitors comprise a first capacitor and a second capacitor sharing a shared second electrode, and wherein the dielectric material is supported on a continuous surface formed by a first electrode of the first capacitor, a first electrode of the second capacitor, and the two separated layers of material, and wherein the shared second electrode is supported in a space bounded by the dielectric material supported on the continuous surface.

A third feature, combinable with any of the following features, wherein the capacitors comprise first holes, and wherein the first holes are lined with the first electrodes, lined with the dielectric material, and filled with the second electrodes.

In a fourth implementation, a system comprises: a memory device comprising: a first wafer comprising capacitors, wherein each capacitor comprises a first electrode and a second electrode separated by an isolation layer, wherein the isolation layer comprises dielectric material having a dielectric constant of 5 or more; and a second wafer comprising a complementary metal-oxide-semiconductor (CMOS) device, wherein the second wafer is hybrid bonded with the first wafer, and a memory controller electrically connected to the memory device, wherein the memory controller is configured to control the memory device.

The breadth and scope of the present disclosure should not be limited by any of the above-described example implementations, but should be defined only in accordance with the following claims and their equivalents. Accordingly, other implementations also are within the scope of the claims.

What is claimed is:

1. A method of fabricating a memory device comprising capacitors, wherein each capacitor comprises a first electrode and a second electrode separated by an isolation layer, the method comprising:
    providing a first wafer comprising:
        a sacrificial material; and
        the first electrodes disposed in first holes and in contact with the sacrificial material;
    hybrid bonding the first wafer with a second wafer comprising a complementary metal-oxide-semiconductor (CMOS) device;
    after hybrid bonding the first wafer with the second wafer, removing the sacrificial material to expose the first electrodes;
    depositing the isolation layer on the first electrodes; and
    forming the second electrodes on the isolation layer.

2. The method of claim 1, wherein providing the first wafer comprises:
    providing an array wafer comprising:
        the sacrificial material; and
        the first holes;
    forming the first wafer comprising the array wafer and a carrier wafer, wherein forming the first wafer comprises:
        bonding the array wafer with the carrier wafer; and
        thinning the array wafer, and
    wherein hybrid bonding the first wafer with the second wafer comprises:
        hybrid bonding the array wafer with the second wafer; and
        removing the carrier wafer from the first wafer to expose the array wafer.

3. The method of claim 1, further comprising:
    depositing a conductive layer on the second electrodes; and
    forming a pad-out structure connected to the conductive layer and the CMOS device.

4. The method of claim 1, wherein the first wafer comprises a semiconductor structure comprising alternating layers of the sacrificial material and dielectric material, and wherein the sacrificial material and the dielectric material are different dielectric materials, and the first holes penetrate through the alternating layers.

5. The method of claim 4, wherein removing the sacrificial material to expose the first electrodes comprises:
    forming second holes penetrating into the alternating layers between the first holes; and
    removing the layers of sacrificial material to expose the first electrodes.

6. The method of claim 5, wherein depositing the isolation layer on the first electrodes comprises:
    depositing the isolation layer into the second holes and around the first holes, wherein the isolation layer is deposited on the first electrodes, on the layers of dielectric material, and on a filling material comprised in the first holes.

7. The method of claim 4, wherein:
    the sacrificial material comprises silicon oxide ($SiO_2$) and the dielectric material comprises silicon nitride ($Si_3N_4$); or
    the sacrificial material comprises $Si_3N_4$ and the dielectric material comprises $SiO_2$.

8. The method of claim 1, wherein providing the first wafer comprises:
    filling the first holes with a filling material to conceal the first electrodes, wherein the sacrificial material and the filling material are different materials.

9. The method of claim 1, wherein the first wafer comprises a semiconductor structure comprising the first holes, and wherein providing the first wafer comprises filling the first holes with the sacrificial material to conceal the first electrodes.

10. The method of claim 9, wherein depositing the isolation layer on the first electrodes comprises:
    depositing the isolation layer into the first holes on the first electrodes.

11. The method of claim 9, wherein the sacrificial material comprises carbon.

12. The method of claim 1, wherein the isolation layer comprises at least one of aluminum oxide, hafnium oxide, or zirconium oxide.

13. The method of claim 1, wherein the first electrodes comprise titanium nitride (TiN).

14. The method of claim 1, wherein the second electrodes comprise TiN and silicon-germanium (SiGe).

15. A method of fabricating a memory device comprising capacitors, wherein each capacitor comprises a first electrode and a second electrode separated by an isolation layer, the method comprising:
    providing a first wafer comprising:
        a sacrificial material; and
        the first electrodes disposed in first holes and in contact with the sacrificial material;
    heat treating the first wafer;
    after heat treating the first wafer, removing the sacrificial material to expose the first electrodes;
    depositing the isolation layer on the first electrodes; and
    forming the second electrodes on the isolation layer.

16. The method of claim 15, wherein the heat treating is at a temperature of 500° C. or more.

17. A memory device comprising:
    a first wafer comprising capacitors, wherein each capacitor comprises a first electrode and a second electrode separated by an isolation layer, and wherein the isolation layer comprises a dielectric material having a dielectric constant of 5 or more; and
    a second wafer comprising a complementary metal-oxide-semiconductor (CMOS) device, wherein the second wafer is hybrid bonded with the first wafer,
    wherein a percentage of a quantity of a group of crystals over a total quantity of crystals in the dielectric material is associated with dimensions of the group of crystals in the dielectric material,
    wherein the dielectric material comprises a smallest crystal having a minimum dimension and a largest crystal having a maximum dimension, and wherein crystals in the dielectric material satisfy one or more dimensional conditions comprising at least one of:
    a percentage of a quantity of a first group of crystals over the total quantity of crystals in the dielectric material is smaller than 20%, wherein the first group of crystals has dimensions between ⅔ *(the minimum dimension+ the maximum dimension) and the maximum dimension;
    a percentage of a quantity of a second group of crystals over the total quantity of crystals in the dielectric material is smaller than 15%, wherein the second group of crystals has dimensions between ¾ *(the minimum dimension+the maximum dimension) and the maximum dimension; or an average dimension of the crystals in the dielectric material is between the minimum dimension and ½ *(the minimum dimension+the maximum dimension).

18. The memory device of claim 17, further comprising two separated layers of material, wherein the capacitors comprise a first capacitor and a second capacitor sharing a shared second electrode, and wherein the dielectric material is supported on a continuous surface formed by a first electrode of the first capacitor, a first electrode of the second capacitor, and the two separated layers of material, and wherein the shared second electrode is supported in a space bounded by the dielectric material supported on the continuous surface.

19. The memory device of claim 17, wherein the capacitors comprise first holes, and wherein the first holes are lined with the first electrodes, lined with the dielectric material, and filled with the second electrodes.

\*    \*    \*    \*    \*